(12) United States Patent
Yoshioka

(10) Patent No.: US 11,342,897 B2
(45) Date of Patent: May 24, 2022

(54) PIEZOELECTRIC RESONATOR DEVICE AND METHOD FOR MANUFACTURING PIEZOELECTRIC RESONATOR DEVICE

(71) Applicant: Daishinku Corporation, Kakogawa (JP)

(72) Inventor: Hiroki Yoshioka, Kakogawa (JP)

(73) Assignee: Daishinku Corporation, Kakogawa (JP)

( * ) Notice: Subject to any disclaimer, the term of this patent is extended or adjusted under 35 U.S.C. 154(b) by 765 days.

(21) Appl. No.: 16/311,701

(22) PCT Filed: May 12, 2017

(86) PCT No.: PCT/JP2017/018088
§ 371 (c)(1),
(2) Date: Dec. 20, 2018

(87) PCT Pub. No.: WO2018/003315
PCT Pub. Date: Jan. 4, 2018

(65) Prior Publication Data
US 2019/0199311 A1     Jun. 27, 2019

(30) Foreign Application Priority Data

Jun. 29, 2016 (JP) .............................. JP2016-129214
Jul. 27, 2016 (JP) .............................. JP2016-147071

(51) Int. Cl.
*H03H 3/02*       (2006.01)
*H03H 9/10*       (2006.01)
(Continued)

(52) U.S. Cl.
CPC ............ *H03H 3/02* (2013.01); *H03H 9/0595* (2013.01); *H03H 9/10* (2013.01); *H03H 9/1035* (2013.01); *H03H 9/17* (2013.01)

(58) Field of Classification Search
CPC ...... H03H 9/1035; H03H 9/0595; H03H 9/17; H03H 9/10
See application file for complete search history.

(56) References Cited

U.S. PATENT DOCUMENTS 8,835,770 B2 * 9/2014 Oyama .................. H01L 21/56
174/256
2008/0231145 A1 * 9/2008 Nagano .................. B22F 7/062
310/344

(Continued)

FOREIGN PATENT DOCUMENTS

JP     2008-178071 A     7/2008
JP     2010-093675 A     4/2010
(Continued)

*Primary Examiner* — Jeffrey M Shin
(74) *Attorney, Agent, or Firm* — Metrolex IP Law Group, PLLC

(57) ABSTRACT

Hermeticity of an annular sealing bonding material to seal a vibrating part is improved. In the crystal resonator 10, a resonator-plate-side first bonding pattern 251 annularly formed on a crystal resonator plate 2 is bonded to a sealing-member-side first bonding pattern 321 annularly formed on a first sealing member 3, and a resonator-plate-side second bonding pattern 252 annularly formed on the crystal resonator plate 2 is bonded to a sealing-member-side second bonding pattern 421 annularly formed on a second sealing member 4. Thus, annular bonding materials 11*a* and 11*b*, which hermetically seal a vibrating part 22 causing piezoelectric resonance, are formed. Inner peripheral edge parts 111*a* and 111*b* and outer peripheral edge parts 112*a* and 112*b* of the bonding materials 11*a* and 11*b* are formed denser than intermediate parts 113*a* and 113*b* between the inner and outer peripheral edge parts 111*a* and 112*a*, and between the inner and outer peripheral edge parts 111*b* and 112*b*.

10 Claims, 23 Drawing Sheets

(51) Int. Cl.
*H03H 9/05* (2006.01)
*H03H 9/17* (2006.01)

(56) References Cited

U.S. PATENT DOCUMENTS

| | | |
|---|---|---|
| 2011/0260577 A1 | 10/2011 | Kohda |
| 2011/0316390 A1 | 12/2011 | Umeki et al. |
| 2012/0074816 A1* | 3/2012 | Mizusawa ............ H03H 9/1035 310/344 |
| 2016/0322952 A1 | 11/2016 | Iizuka et al. |

FOREIGN PATENT DOCUMENTS

| | | |
|---|---|---|
| JP | 2010-246001 A | 10/2010 |
| JP | 2010-252051 A | 11/2010 |
| JP | 2012-009969 A | 1/2012 |
| JP | 2012-034302 A | 2/2012 |
| JP | 2015-122568 A | 7/2015 |
| JP | 2015-216322 A | 12/2015 |
| WO | WO 2010/001885 A1 | 1/2010 |

\* cited by examiner

PIEZOELECTRIC RESONATOR DEVICE AND METHOD FOR MANUFACTURING PIEZOELECTRIC RESONATOR DEVICE

TECHNICAL FIELD

The present invention relates to a piezoelectric resonator device and a method for manufacturing the piezoelectric resonator device.

BACKGROUND ART

Recent years, in various electronic devices, their operating frequencies have increased and their packages (especially, their height) have been downsized. According to such an increase in operating frequency and a reduction in package size, there is also a need for piezoelectric resonator devices (such as a crystal resonator and a crystal oscillator) to be adaptable to the increase in operating frequency and the reduction in package size.

In this kind of piezoelectric resonator devices, a housing is constituted of a substantially rectangular parallelepiped-shaped package. The package is constituted of: a first sealing member and a second sealing member both made of glass or crystal; and a crystal resonator plate made of crystal. On respective main surfaces of the crystal resonator plate, excitation electrodes are formed. The first sealing member and the second sealing member are laminated and bonded via the crystal resonator plate. Thus, the excitation electrodes of the crystal resonator plate, which are disposed in the package (in the internal space), are hermetically sealed (for example, see Patent Document 1). Hereinafter, such a laminated structure of the piezoelectric resonator device is referred to as a sandwich structure.

PRIOR ART DOCUMENT

Patent Document

Patent Document 1: JP 2010-252051 A

SUMMARY OF THE INVENTION

Problem to be Solved by the Invention

In the above-described piezoelectric resonator device, a vibrating part of the piezoelectric resonator plate is hermetically sealed, for example, by annular metal patterns (metal films) respectively formed on the first sealing member, the piezoelectric resonator plate and the second sealing member. In this case, the respective metal patterns of the first sealing member and the piezoelectric resonator plate are bonded to each other, and the respective metal patterns of the piezoelectric resonator plate and the second sealing member are bonded to each other. Thus, sealing parts (sealing bonding materials) that seal the vibrating part causing piezoelectric resonance are formed so as to each have an annular shape that surrounds the outer periphery of the vibrating part in plan view. In such a piezoelectric resonator device having the sandwich structure, it is necessary to improve hermeticity of the annular sealing bonding material that is interposed between the first sealing member and the piezoelectric resonator plate, as well as the annular sealing bonding material that is interposed between the piezoelectric resonator plate and the second sealing member.

Not only in the piezoelectric resonator device having the sandwich structure, but also in a piezoelectric resonator device having a configuration in which a piezoelectric resonator piece (vibrating part) causing piezoelectric resonance is housed in a space formed by a base and a lid, it is necessary to improve hermeticity of the annular sealing bonding material that is interposed between the base and the lid.

The present invention was made in consideration of the above circumstances, an object of which is to provide a piezoelectric resonator device capable of improving hermeticity of an annular sealing bonding material that hermetically seals the region surrounding the outer periphery of a vibrating part causing piezoelectric resonance, and also to provide a method for manufacturing the piezoelectric resonator device.

Means for Solving the Problem

In order to solve the above problem, the present invention is configured as stated below. A piezoelectric resonator device of the present invention includes: a first member on which a first metal film is annularly formed; a second member on which a second metal film is annularly formed; an annular sealing bonding material made by bonding the first metal film and the second metal film to each other; and a vibrating part hermetically sealed by the sealing bonding material, the vibrating part causing piezoelectric resonance. An inner peripheral edge part and an outer peripheral edge part of the sealing bonding material are each formed denser than an intermediate part between the inner peripheral edge part and the outer peripheral edge part. Here, forming the bonding material "in the dense state" means that it is formed to include a relatively small number of voids generated inside the bonding material. Conversely, when the bonding material is formed so as to include a relatively large number of voids generated inside the bonding material, the bonding material is formed "in the sparse state".

In the present invention, it is possible to improve the hermeticity of the sealing bonding material that seals the vibrating part causing piezoelectric resonance by disposing a plurality of dense bonding regions (specifically, the inner peripheral edge part and the outer peripheral edge part) in the sealing bonding material. That is, the inner peripheral edge part and the outer peripheral edge part, which are the dense bonding regions including a relatively small number of voids, are formed to each have an annular shape. This means that the vibrating part is doubly sealed by the inner and outer peripheral edge parts. Therefore, with the above-described configuration, it is possible to improve the hermeticity of the sealing bonding material compared to the cases in which: no dense bonding region is provided; the dense bonding region is not formed to have an annular shape; or only one annular and dense bonding region is formed.

In the present invention, the first metal film and the second metal film may each be formed so as to be divided into an inner peripheral side metal film and an outer peripheral side metal film by an annular slit, and the sealing bonding material may be formed so as to be divided into an inner peripheral side sealing bonding material and an outer peripheral side sealing bonding material. Alternatively, the first metal film may be formed so as to be divided into an inner peripheral side metal film and an outer peripheral side metal film by an annular slit, and the sealing bonding material may be formed so as to be divided into an inner peripheral side sealing bonding material and an outer peripheral side sealing bonding material.

In the present invention, each of the inner peripheral side sealing bonding material and the outer peripheral side sealing bonding material has a plurality of bonding regions in the dense state, specifically, the inner peripheral edge part and the outer peripheral edge part. Therefore, it is possible to improve the hermeticity of the inner peripheral side sealing bonding material and the outer peripheral side sealing bonding material that seal the vibrating part causing piezoelectric resonance.

In the present invention, respective positions of the outer peripheral edges of the first metal film and the second metal film may differ from each other in plan view.

In the present invention, it is possible to absorb the lamination displacement (position displacement) that is generated when the first member and the second member are laminated and bonded. Accordingly, even when such a lamination displacement is generated, it is possible to form the inner peripheral edge part and the outer peripheral edge part of the bonding material in the dense state.

The piezoelectric resonator device of the present invention may further include: a piezoelectric resonator plate that includes a first excitation electrode formed on a first main surface of a substrate and a second excitation electrode, which makes a pair with the first excitation electrode, formed on a second main surface of the substrate; a first sealing member covering the first excitation electrode of the piezoelectric resonator plate; and a second sealing member covering the second excitation electrode of the piezoelectric resonator plate. The sealing bonding material may be interposed between the first sealing member and the piezoelectric resonator plate, and furthermore between the piezoelectric resonator plate and the second sealing member. In this case, it is preferable that the first sealing member and the second sealing member are each made of a brittle material having a thickness of 30 to 80 μm, and that a gap between the first sealing member and the piezoelectric resonator plate and a gap between the piezoelectric resonator plate and the second sealing member are each set to 0.1 times or less the thickness of the first sealing member and the second sealing member.

In the present invention, by forming the sealing bonding material in the pressurized state, it is possible to form the inner peripheral edge part and the outer peripheral edge part of the sealing bonding material in a further dense state than the case in which the sealing bonding material is not pressurized to be formed. Thus, the hermeticity of the sealing bonding material can be further improved.

Also, in a method for manufacturing a piezoelectric resonator device of the present invention, the piezoelectric resonator device includes: a first member on which a first metal film is annularly formed; a second member on which a second metal film is annularly formed; an annular sealing bonding material made by bonding the first metal film and the second metal film to each other; and a vibrating part that is hermetically sealed by the sealing bonding material and that causes piezoelectric resonance. The first metal film and the second metal film are both metal films made of Au and formed by sputtering. The sealing bonding material is formed in a pressurized state.

In the present invention, the first metal film and the second metal film can be easily formed respectively on the first member and the second member by sputtering. Furthermore, since the sealing bonding material is formed by bonding (Au—Au bonding) in the pressurized state, it is possible to increase the bonding strength of the sealing bonding material. In addition, when the sealing bonding material is formed, the inner peripheral edge part and the outer peripheral edge part of the annular sealing bonding material are formed denser than the intermediate part between the inner peripheral edge part and the outer peripheral edge part (i.e. formed in the state including a relatively small number of voids). Thus, it is possible to improve the hermeticity of the sealing bonding material that seals the vibrating part causing piezoelectric resonance. In other words, since the annular sealing bonding material has a plurality of bonding regions in the dense state (specifically, the inner peripheral edge part and the outer peripheral edge part), it is possible to improve the hermeticity of the sealing bonding material that seals the vibrating part causing piezoelectric resonance. To be specific, the inner peripheral edge part and the outer peripheral edge part, which are dense bonding regions including a relatively small number of voids, are formed to each have an annular shape. This means that the vibrating part is doubly sealed by the inner and outer peripheral edge parts. Therefore, in the present invention, it is possible to improve the hermeticity of the sealing bonding material compared to the cases in which: no dense bonding region is provided; the dense bonding region is not formed to have an annular shape; or only one annular and dense bonding region is formed.

The second member of the present invention may be made of a brittle material having a thickness of 30 to 80 μm, and a gap between the first member and the second member may be set to 0.1 times or less the thickness of the second member.

In the present invention, when the bonding is performed in the pressurized state, it is possible to form the inner peripheral edge part and the outer peripheral edge part of the sealing bonding material in a further dense state, which further improves the hermeticity of the sealing bonding material. It is preferable to use the second member having a flat plate shape from the viewpoint of reduction in processing cost, simplification of the structure, and ensuring the total rigidity of the second member and the piezoelectric resonator device.

In the present invention, either one of the first metal film and the second metal film may be formed so as to be divided into an inner peripheral side metal film and an outer peripheral side metal film by an annular slit, and the sealing bonding material may be formed so as to be divided into the inner peripheral side sealing bonding material and the outer peripheral side sealing bonding material. Alternatively, the first metal film and the second metal film may each be formed so as to be divided into the inner peripheral side metal film and the outer peripheral side metal film by the annular slit, and the sealing bonding material may be formed so as to be divided into the inner peripheral side sealing bonding material and the outer peripheral side sealing bonding material.

In the present invention, each of the inner peripheral side sealing bonding material and the outer peripheral side sealing bonding material has a plurality of bonding regions in the dense state, specifically, the inner peripheral edge part and the outer peripheral edge part. Therefore, it is possible to improve the hermeticity of the inner peripheral side sealing bonding material and the outer peripheral side sealing bonding material that seal the vibrating part causing piezoelectric resonance.

The piezoelectric resonator device of the present invention may further include: the piezoelectric resonator plate that includes the first excitation electrode formed on the first main surface of a substrate and the second excitation electrode, which makes a pair with the first excitation electrode, formed on the second main surface of the substrate; the first sealing member covering the first excitation electrode of the piezoelectric resonator plate; and the second sealing member covering the second excitation electrode of the piezoelectric resonator plate. The sealing bonding material may be formed between the first sealing member and the piezoelectric resonator plate, and furthermore between the piezoelectric resonator plate and the second sealing member.

In the present invention, when the bonding is performed in the pressurized state, it is possible to form the inner peripheral edge part and the outer peripheral edge part of the sealing bonding material in a further dense state, which further improves the hermeticity of the sealing bonding material.

Effect of the Invention

In the present invention, the inner peripheral edge part and the outer peripheral edge part, which are the dense bonding regions, are formed to each have an annular shape. Thus, the vibrating part is doubly sealed by the inner and outer peripheral edge parts. Therefore, it is possible to improve the hermeticity of the sealing bonding material.

MODE FOR CARRYING OUT THE INVENTION

Hereinafter, an embodiment of the present invention will be described with reference to the drawings. In the following embodiment, the present invention is applied to a crystal resonator.

—Crystal Resonator—

Figure 1:
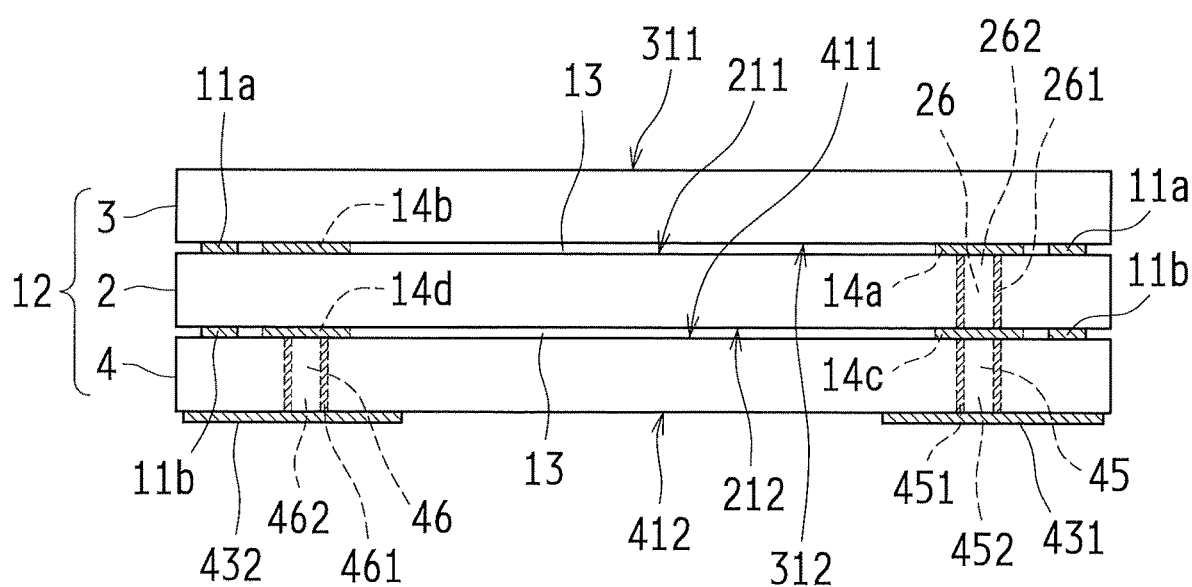
FIG. 1 is a schematic configuration diagram schematically illustrating a configuration of a crystal resonator according to an embodiment.
Figure 1:
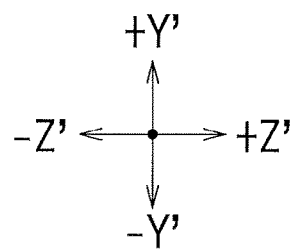

As shown in FIG. 1, a crystal resonator 10 according to this embodiment includes: a crystal resonator plate 2 (first member); a first sealing member (second member) 3 that covers a first excitation electrode 221 (see FIG. 4) of the crystal resonator plate 2 so as to hermetically seal the first excitation electrode 221 that is formed on a first main surface 211 of the crystal resonator plate 2; and a second sealing member (second member) 4 disposed on a side of a second main surface 212 of the crystal resonator plate 2 so as to cover a second excitation electrode 222 (see FIG. 5) of the crystal resonator plate 2, the second sealing member 4 hermetically sealing the second excitation electrode 222 that makes a pair with the first excitation electrode 221. In the crystal resonator 10, the crystal resonator plate 2 is bonded to the first sealing member 3, and also the crystal resonator plate 2 is bonded to the second sealing member 4. Thus, a package 12 having a sandwich structure is constituted.

In the crystal resonator 10, the crystal resonator plate 2 is bonded to the first sealing member 3, and the crystal resonator plate 2 is bonded to the second sealing member 4. Thus, an internal space 13 of the package 12 is formed. In this internal space 13 of the package 12, a vibrating part 22 is hermetically sealed. The vibrating part 22 includes the first excitation electrode 221 and the second excitation electrode 222 respectively formed on both main surfaces 211 and 212 of the crystal resonator plate 2. The crystal resonator 10 according to this embodiment has, for example, a package size of 1.0×0.8 mm, which is reduced in size and height. According to the size reduction, no castellation is formed in the package 12. Through holes (first to third through holes) are used for conduction between electrodes.

Next, the configuration of the above-described crystal resonator 10 will be described referring to FIGS. 1 to 7. Here, each of the crystal resonator plate 2, the first sealing member 3 and the second sealing member 4 will be described as a single body without being bonded.

Figure 4:
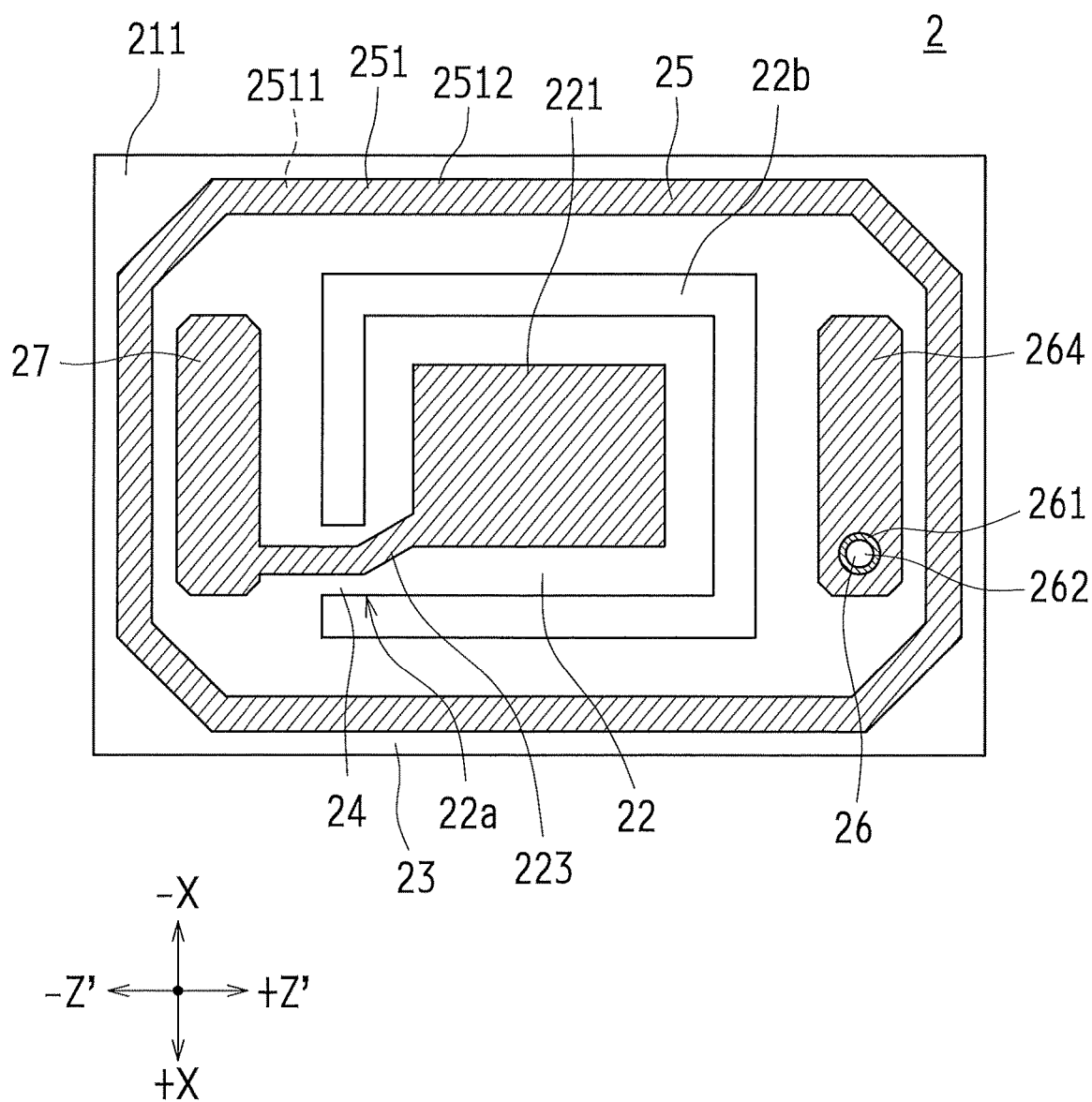
FIG. 4 is a schematic plan view illustrating a crystal resonator plate of the crystal resonator.
Figure 5:
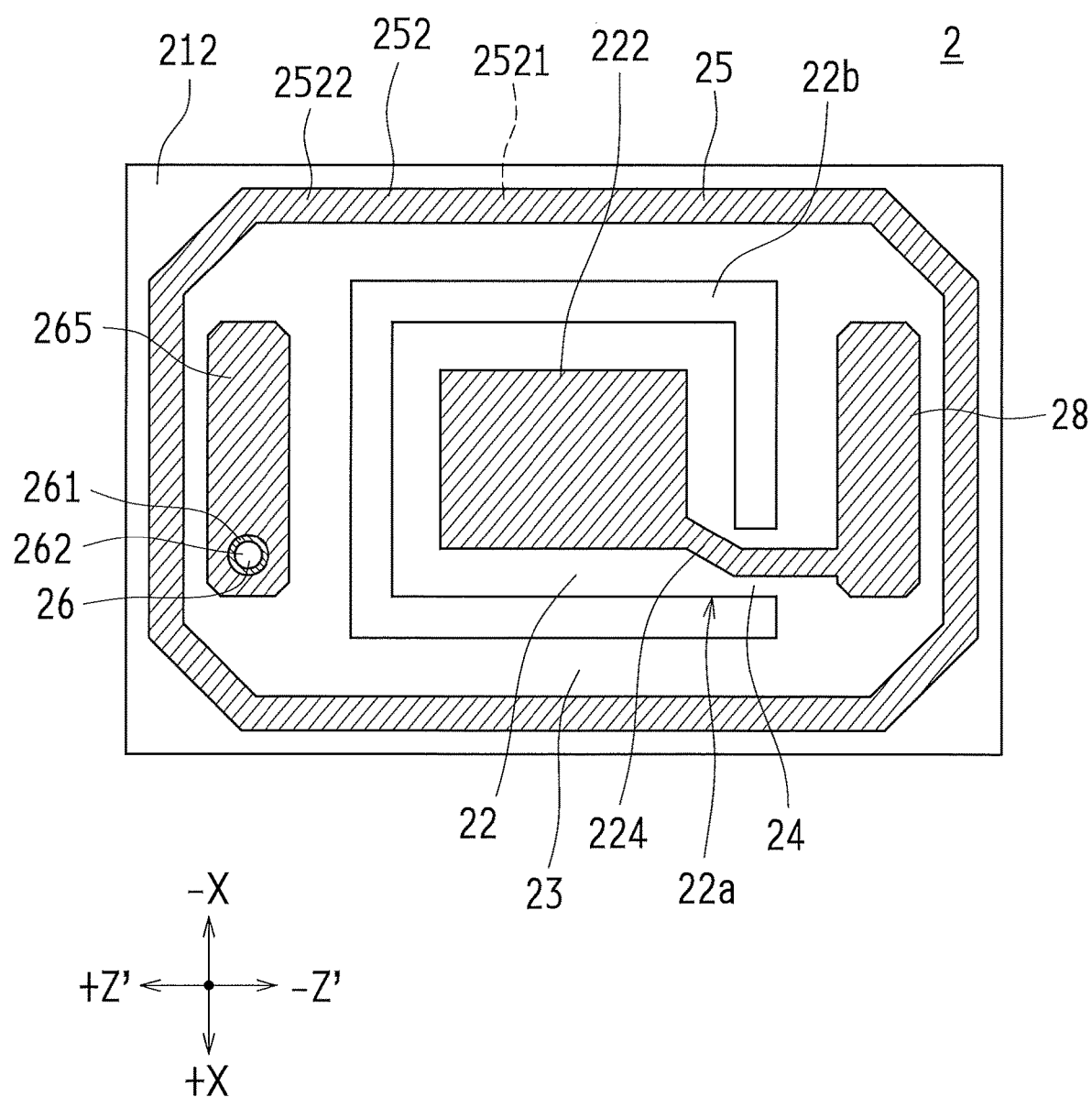
FIG. 5 is a schematic rear view illustrating the crystal resonator plate of the crystal resonator.

As shown in FIGS. 4 and 5, the crystal resonator plate 2 is a piezoelectric substrate made of crystal. Both main surfaces (the first main surface 211 and the second main surface 212) are formed as smooth flat surfaces (mirror-finished). In this embodiment, an AT-cut crystal plate that causes thickness shear vibration is used as the crystal resonator plate 2. In the crystal resonator plate 2 shown in FIGS. 4 and 5, both main surfaces 211 and 212 of the crystal resonator plate 2 are an XZ' plane. On this XZ' plane, a direction in parallel with the lateral direction (short side direction) of the crystal resonator plate 2 is the X axis direction, and a direction in parallel with the longitudinal direction (long side direction) of the crystal resonator plate 2 is the Z' axis direction. The AT-cut method is a processing method in which a crystal plate is cut out of synthetic quartz crystal at an angle tilted by 35° 15' about an X axis from a Z axis, out of the three crystal axes (i.e. an electrical axis (X axis), a mechanical axis (Y axis) and an optical axis (Z axis)) of the synthetic quartz crystal. The X axis of the AT-cut crystal plate equals the crystal axis of the crystal. The Y' axis and the Z' axis equal the respective axes that tilt by 35° 15' from the Y axis and the Z axis out of the crystal axes of the crystal. The Y' axis direction and the Z' axis direction correspond to the direction in which the AT-cut crystal is cut out.

A pair of excitation electrodes (i.e. the first excitation electrode 221 and the second excitation electrode 222) is formed, respectively, on the main surfaces 211 and 212 of the crystal resonator plate 2. The crystal resonator plate 2 includes: the vibrating part 22 formed so as to have a substantially rectangular shape; an external frame part 23 surrounding the outer periphery of the vibrating part 22; and a connecting (holding) part 24 that connects the vibrating part 22 to the external frame part 23. The vibrating part 22, the connecting part 24 and the external frame part 23 are integrally formed. In this embodiment, the connecting part 24 is provided at only one position between the vibrating part 22 and the external frame part 23, and the remaining part between the vibrating part 22 and the external frame part 23 on which the connecting part 24 is not provided is made as a space (clearance) 22b. Although it is not shown in the drawings, the vibrating part 22 and the connecting part 24 are formed so as to have a thickness thinner than the external frame part 23. Due to the difference in the thickness between the external frame part 23 and the connecting part 24, the natural frequency of piezoelectric vibration differs between the external frame part 23 and the connecting part 24. Thus, the external frame part 23 is not likely to resonate with the piezoelectric vibration of the connecting part 24.

The connecting part 24 extends (protrudes) from only one corner part 22a positioned in the +X direction and in the −Z' direction of the vibrating part 22 to the external frame part 23 in the −Z' direction. Thus, since the connecting part 24 is disposed on the corner part 22a where displacement of the piezoelectric vibration is relatively small in the outer peripheral edge part of the vibrating part 22, it is possible to prevent leakage of the piezoelectric vibration to the external frame part 23 via the connecting part 24 compared to the case in which the connecting part 24 is provided on the position other than the corner part 22a (i.e. central part of the respective sides), which makes the vibrating part 22 piezoelectrically vibrate more effectively. Furthermore, compared to the configuration in which two or more connecting parts 24 are disposed, it is possible to reduce a stress applied to the vibrating part 22, which results in reduction in frequency shift of the piezoelectric vibration due to the stress. Thus, stability of the piezoelectric vibration can be improved.

The first excitation electrode 221 is provided on the first main surface of the vibrating part 22 while the second excitation electrode 222 is provided on the second main surface of the vibrating part 22. Extraction electrodes (a first extraction electrode 223 and a second extraction electrode 224), which are connected to external electrode terminals (a first external electrode terminal 431 and a second external electrode terminal 432), are respectively connected to the first excitation electrode 221 and the second excitation electrode 222. The first extraction electrode 223 is drawn from the first excitation electrode 221 and connected to a connecting bonding pattern 27 formed on the external frame part 23 via the connecting part 24. The second extraction electrode 224 is drawn from the second excitation electrode 222 and connected to a connecting bonding pattern 28 formed on the external frame part 23 via the connecting part 24. Accordingly, the first extraction electrode 223 is formed on the first main surface side of the connecting part 24, and the second extraction electrode 224 is formed on the second main surface side of the connecting part 24. The first excitation electrode 221 and the first extraction electrode 223 are constituted of a base PVD film deposited on the first main surface 211 by physical vapor deposition, and an electrode PVD film deposited on the base PVD film by the physical vapor deposition. The second excitation electrode 222 and the second extraction electrode 224 are constituted of a base PVD film deposited on the second main surface 212 by the physical vapor deposition, and an electrode PVD film deposited on the base PVD film by the physical vapor deposition.

Resonator-plate-side sealing parts 25 for bonding the crystal resonator plate 2 respectively to the first sealing member 3 and the second sealing member 4 are provided on the respective main surfaces 211 and 212 of the crystal resonator plate 2. On the resonator-plate-side sealing part 25 on the first main surface 211 of the crystal resonator plate 2, a resonator-plate-side first bonding pattern (first metal film) 251 is formed so as to be bonded to the first sealing member 3. Also, on the resonator-plate-side sealing part 25 on the second main surface 212 of the crystal resonator plate 2, a resonator-plate-side second bonding pattern (first metal film) 252 is formed so as to be bonded to the second sealing member 4. The resonator-plate-side first bonding pattern 251 and the resonator-plate-side second bonding pattern 252 are each formed on the external frame part 23 so as to have an annular shape in plan view, with their respective outer edges and inner edges each having a substantially octagonal shape. The resonator-plate-side first bonding pattern 251 and the resonator-plate-side second bonding pattern 252 are disposed on the respective main surfaces 211 and 212 of the crystal resonator plate 2 so as to be close to the outer peripheral edge of the main surfaces 211 and 212. The pair of first excitation electrode 221 and second excitation electrode 222 of the crystal resonator plate 2 is not electrically connected to the resonator-plate-side first bonding pattern 251 and the resonator-plate-side second bonding pattern 252.

The resonator-plate-side first bonding pattern 251 is constituted of a base PVD film 2511 deposited on the first main surface 211 by the physical vapor deposition, and an electrode PVD film 2512 deposited on the base PVD film 2511 by the physical vapor deposition. The resonator-plate-side second bonding pattern 252 is constituted of a base PVD film 2521 deposited on the second main surface 212 by the physical vapor deposition, and an electrode PVD film 2522 deposited on the base PVD film 2521 by the physical vapor deposition. That is, the resonator-plate-side first bonding pattern 251 and the resonator-plate-side second bonding pattern 252 have the same configuration in which a plurality of layers is laminated on the resonator-plate-side sealing part 25 of each main surface 211 and 212, specifically, a Ti layer (or a Cr layer) and an Au layer are deposited by vapor deposition in this order from the lowermost layer side. Like this, in the resonator-plate-side first bonding pattern 251 and the resonator-plate-side second bonding pattern 252, the base PVD films 2511 and 2521 are made of a single material (Ti or Cr), the electrode PVD films 2512 and 2522 are made of a single material (Au), and the electrode PVD films 2512 and 2522 have a thickness greater than the thickness of the base PVD films 2511 and 2521. The first excitation electrode 221 and the resonator-plate-side first bonding pattern 251 both formed on the first main surface 211 of the crystal resonator plate 2 have the same thickness, and the surfaces of the first excitation electrode 221 and the resonator-plate-side first bonding pattern 251 are made of the same metal. The second excitation electrode 222 and the resonator-plate-side second bonding pattern 252 both formed on the second main surface 212 of the crystal resonator plate 2 have the same thickness, and the surfaces of the second excitation electrode 222 and the resonator-plate-side second bonding pattern 252 are made of the same metal.

Thus, the first excitation electrode 221, the first extraction electrode 223 and the resonator-plate-side first bonding pattern 251 can have the same configuration. In this case, it is possible to form collectively the first excitation electrode 221, the first extraction electrode 223 and the resonator-plate-side first bonding pattern 251 in the same process (for example, by sputtering). Similarly to the above, the second excitation electrode 222, the second extraction electrode 224 and the resonator-plate-side second bonding pattern 252 can have the same configuration. In this case, it is possible to form collectively the second excitation electrode 222, the second extraction electrode 224 and the resonator-plate-side second bonding pattern 252 in the same process.

Also, as shown in FIGS. 4 and 5, a through hole (first through hole 26) is formed in the crystal resonator plate 2 so as to penetrate between the first main surface 211 and the second main surface 212. The first through hole 26 is disposed in the external frame part 23 of the crystal resonator plate 2. The first through hole 26 is connected to a connecting bonding pattern 453 of the second sealing member 4.

In the first through hole 26, a through electrode 261 is formed along an inner wall surface of the first through hole 26 so as to establish conduction between the electrodes formed on the first main surface 211 and the second main surface 212, as shown in FIGS. 1, 4 and 5. A central part of the first through hole 26 is a hollow through part 262 penetrating between the first main surface 211 and the second main surface 212. Connecting bonding patterns 264 and 265 are formed on respective outer peripheral regions of the first through hole 26. The connecting bonding patterns 264 and 265 are formed respectively on the main surfaces 211 and 212 of the crystal resonator plate 2.

The connecting bonding pattern 264 of the first through hole 26 formed on the first main surface 211 of the crystal resonator plate 2 extends on the external frame part 23 in the X axis direction. The connecting bonding pattern 27 is formed on the first main surface 211 of the crystal resonator plate 2 so as to be connected to the first extraction electrode 223. The connecting bonding pattern 27 also extends on the external frame part 23 in the X axis direction. The connecting bonding pattern 27 is formed on the side opposite to the connecting bonding pattern 264 in the Z' axis direction with the vibrating part 22 (the first excitation electrode 221) being interposed therebetween. That is, the connecting bonding patterns 27 and 264 are formed respectively on both sides of the vibrating part 22 in the Z' axis direction.

Similarly to the above, the connecting bonding pattern 265 of the first through hole 26 formed on the second main surface 212 of the crystal resonator plate 2 extends on the external frame part 23 in the X axis direction. The connecting bonding pattern 28 is formed on the second main surface 212 of the crystal resonator plate 2 so as to be connected to the second extraction electrode 224. The connecting bonding pattern 28 also extends on the external frame part 23 in the X axis direction. The connecting bonding pattern 28 is formed on the side opposite to the connecting bonding pattern 265 in the Z' axis direction with the vibrating part 22 (the second excitation electrode 222) being interposed therebetween. That is, the connecting bonding patterns 28 and 265 are formed respectively on both sides of the vibrating part 22 in the Z' axis direction.

The connecting bonding patterns 27, 28, 264 and 265 have the same configuration as the resonator-plate-side first bonding pattern 251 and the resonator-plate-side second bonding pattern 252, accordingly, they can be formed by the same process as that for the resonator-plate-side first bonding pattern 251 and the resonator-plate-side second bonding pattern 252. Specifically, each connecting bonding pattern 27, 28, 264 and 265 is constituted of a base PVD film deposited on each main surface (the first main surface 211 and the second main surface 212) of the crystal resonator plate 2 by the physical vapor deposition, and an electrode PVD film deposited on the base PVD film by the physical vapor deposition.

In the crystal resonator 10, the first through hole 26 and the connecting bonding patterns 27, 28, 264 and 265 are formed in the inward position of the internal space 13 (inside of respective inner peripheral surfaces of bonding materials 11a and 11b) in plan view. The internal space 13 is formed in the inward position (inside) of the resonator-plate-side first bonding pattern 251 and the resonator-plate-side second bonding pattern 252 in plan view. The inward position of the internal space 13 means strictly the inner side of the respective inner peripheral surfaces of the bonding materials 11a and 11b (described later), not including the positions on the bonding materials 11a and 11b. The first through hole 26 and the connecting bonding patterns 27, 28, 264 and 265 are not electrically connected to the resonator-plate-side first bonding pattern 251 and the resonator-plate-side second bonding pattern 252.

Figure 2:
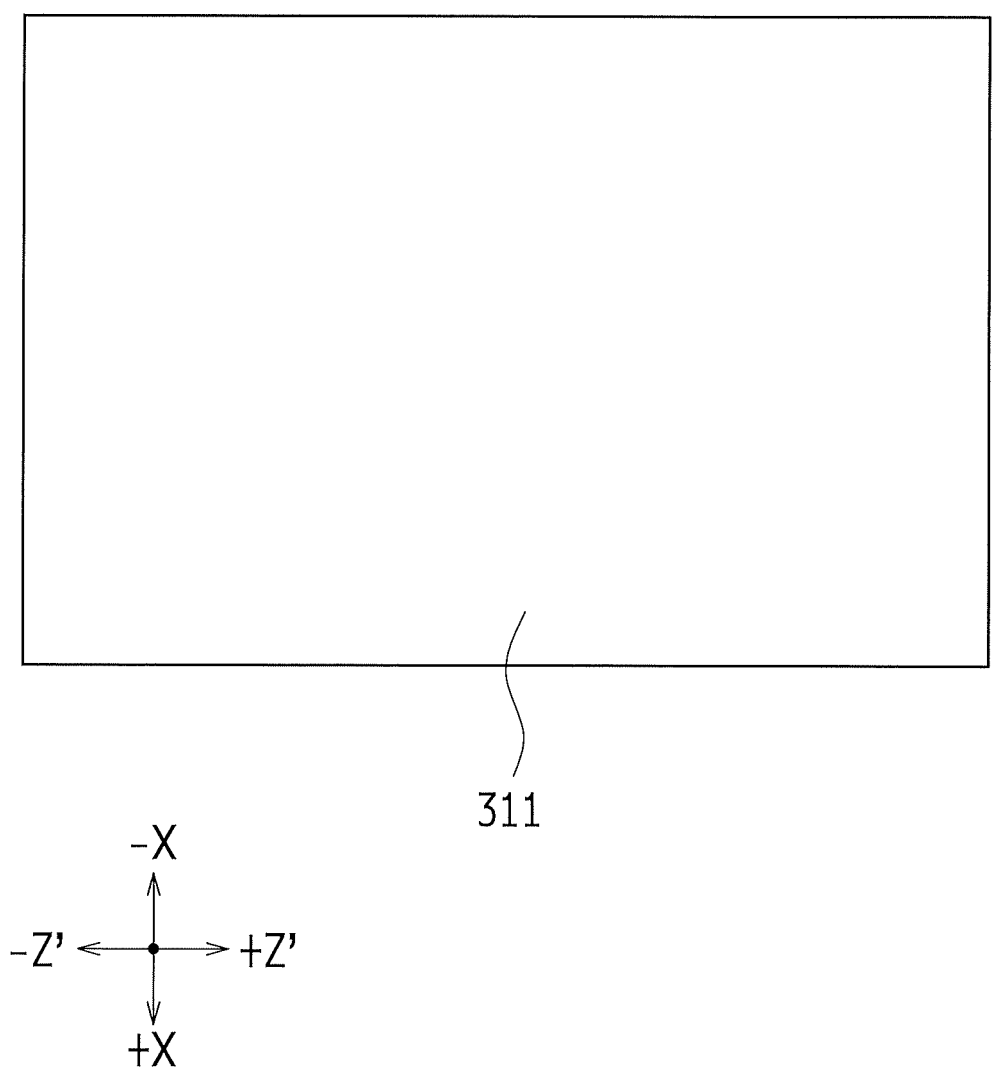
FIG. 2 is a schematic plan view illustrating a first sealing member of the crystal resonator.
Figure 3:
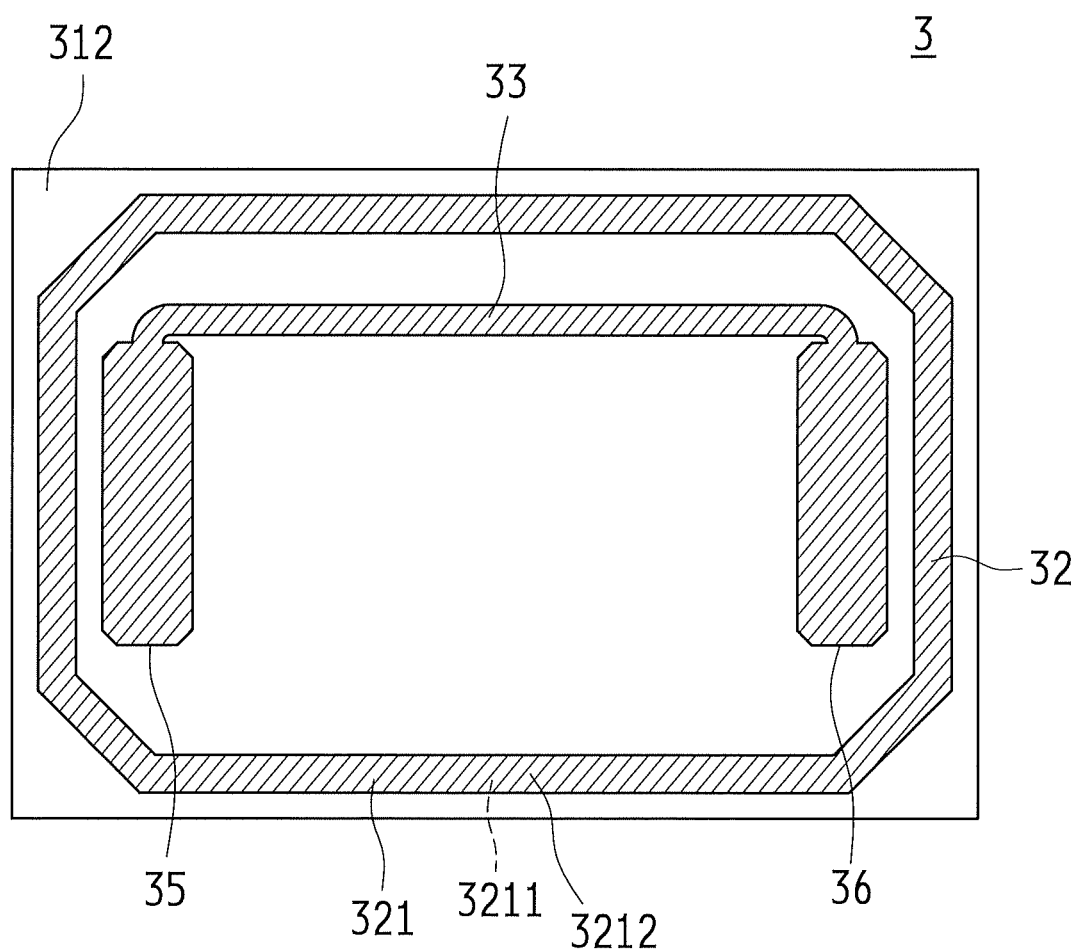
FIG. 3 is a schematic rear view illustrating the first sealing member of the crystal resonator.
Figure 3:
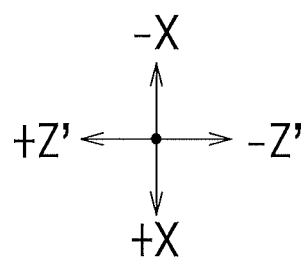

The first sealing member 3 is made of a brittle material having the flexural rigidity (moment of inertia of area× Young's modulus) of not more than 1000 [N·mm$^2$]. Specifically, as shown in FIGS. 2 and 3, the first sealing member 3 is a substrate having a substantially rectangular parallelepiped shape (flat plate shape) that is made of crystal. A second main surface 312 (a surface to be bonded to the crystal resonator plate 2) of the first sealing member 3 is formed as a smooth flat surface (mirror finished). In this embodiment, an AT-cut crystal plate is used as the first sealing member 3 similarly to the above-described crystal resonator plate 2. The thickness of the first sealing member 3 is set in the range from 30 to 80 μm.

On the second main surface 312 of the first sealing member 3, a sealing-member-side first sealing part 32 is disposed so as to be bonded to the crystal resonator plate 2. A sealing-member-side first bonding pattern (second metal film) 321 is formed on the sealing-member side first sealing part 32 so as to be bonded to the crystal resonator plate 2. The sealing-member-side first bonding pattern 321 is formed so as to have an annular shape in plan view, and more specifically, its outer edge and inner edge each have a substantially octagonal shape. The sealing-member-side first bonding pattern 321 is disposed so as to be close to the outer peripheral edge of the second main surface 312 of the first sealing member 3. The sealing-member-side first bonding pattern 321 has substantially the same width at all positions on the sealing-member-side first sealing part 32 of the first sealing member 3.

The sealing-member-side first bonding pattern 321 is constituted of a base PVD film 3211 deposited on the first sealing member 3 by the physical vapor deposition, and an electrode PVD film 3212 deposited on the base PVD film 3211 by the physical vapor deposition. In this embodiment, the base PVD film 3211 is made of Ti (or Cr), and the electrode PVD film 3212 is made of Au. Specifically, the sealing-member-side first bonding pattern 321 is made of a plurality of layers laminated on the sealing-member-side first sealing part 32 of the second main surface 312, that is, a Ti layer (or a Cr layer) and an Au layer are deposited by the vapor deposition in this order from the lowermost layer side.

On the second main surface 312 (i.e. the surface facing the crystal resonator plate 2) of the sealing member 3, connecting bonding patterns 35 and 36 are formed so as to be bonded, respectively, to the connecting bonding patterns 264 and 27 of the crystal resonator plate 2. The connecting bonding patterns 35 and 36 extend in the short side direction (in the X axis direction in FIG. 3) of the first sealing member 3. The connecting bonding patterns 35 and 36 are provided at a predetermined interval in the long side direction (in the Z' axis direction in FIG. 3) of the first sealing member 3. The interval between the connecting bonding patterns 35 and 36 in the Z' axis direction is substantially the same as the interval between the connecting bonding patterns 264 and 27 in the Z' axis direction of the crystal resonator plate 2 (see FIG. 4). The connecting bonding patterns 35 and 36 are connected to each other via a wiring pattern 33. The wiring pattern 33 is disposed between the connecting bonding patterns 35 and 36. The wiring pattern 33 extends in the Z' axis direction. The wiring pattern 33 is not bonded to the connecting bonding patterns 264 and 27 of the crystal resonator plate 2.

The connecting bonding patterns 35 and 36, and the wiring pattern 33 have the same configuration as the sealing-member-side first bonding pattern 321, accordingly, they can be formed by the same process (for example, by sputtering) as that for the sealing-member-side first bonding pattern 321. Specifically, each of the connecting bonding patterns 35 and 36 and the wiring pattern 33 is constituted of a base PVD film deposited on the second main surface 312 of the first sealing member 3 by the physical vapor deposition, and an electrode PVD film deposited on the base PVD film by the physical vapor deposition.

In the configuration of the crystal resonator 10, the connecting bonding patterns 35 and 36, and the wiring pattern 33 are formed in the inward position of the internal space 13 (inside of the respective inner peripheral surfaces of the bonding materials 11a and 11b) in plan view. The connecting bonding patterns 35 and 36, and the wiring pattern 33 are not electrically connected to the sealing-member-side first bonding pattern 321.

Figure 6:
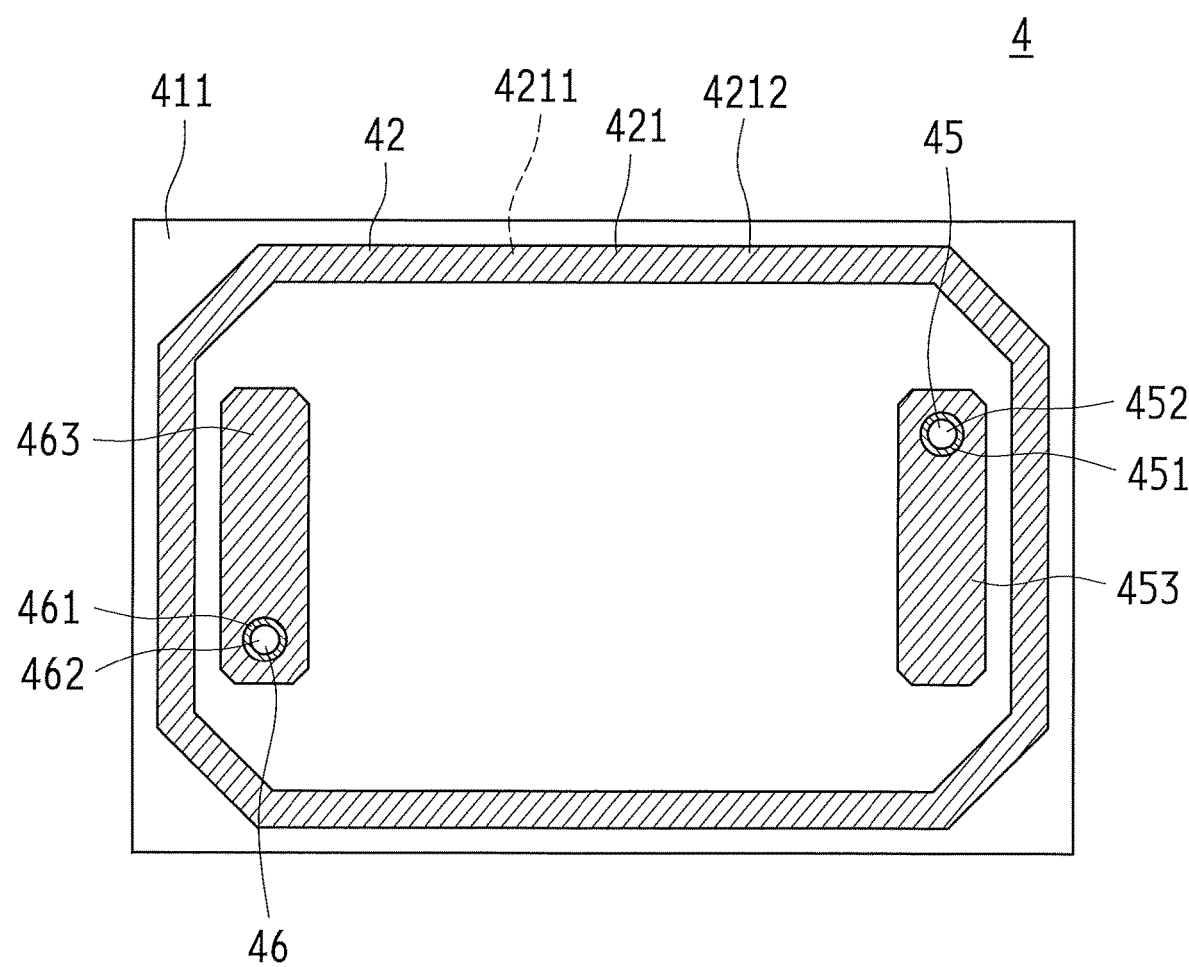
FIG. 6 is a schematic plan view illustrating a second sealing member of the crystal resonator.
Figure 7:
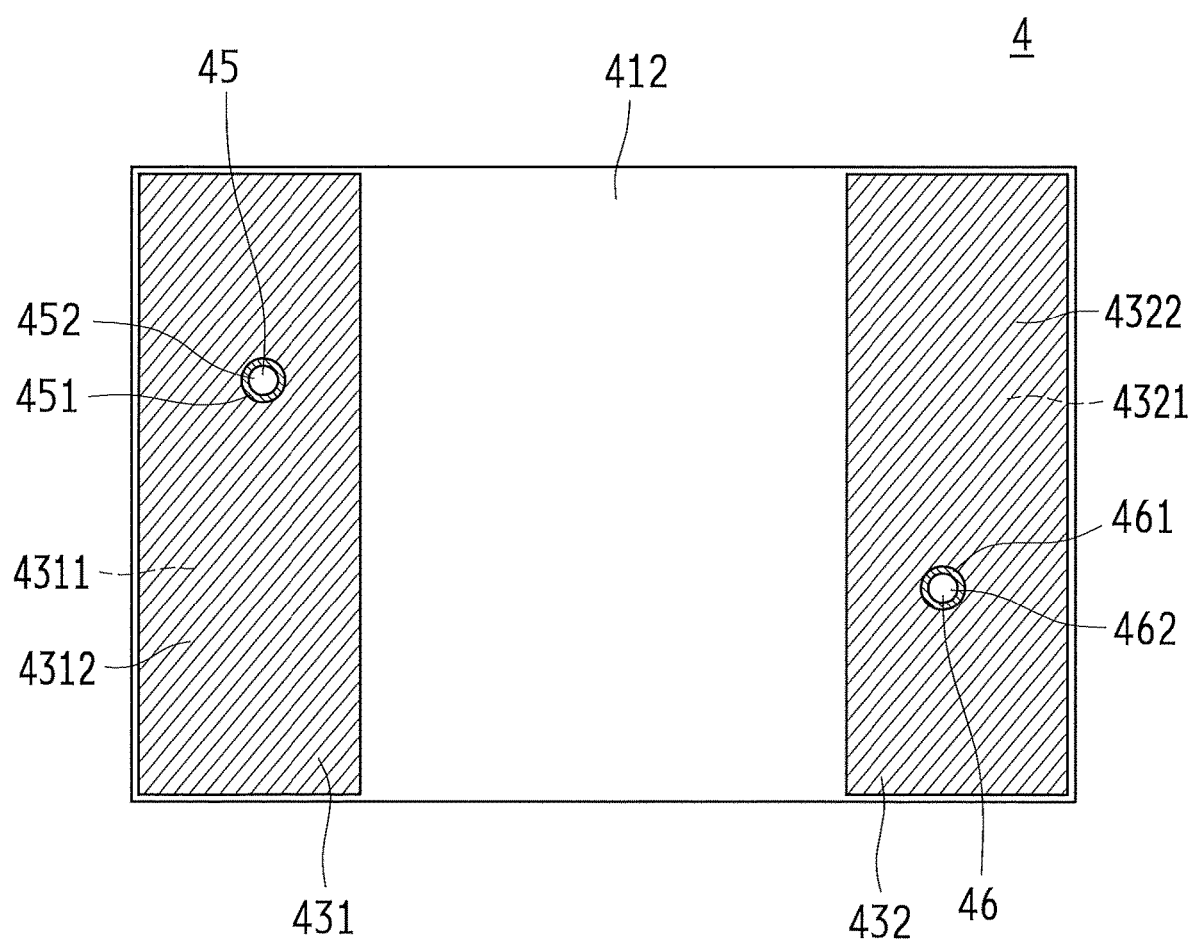
FIG. 7 is a schematic rear view illustrating the second sealing member of the crystal resonator.

The second sealing member 4 is made of a brittle material having the flexural rigidity (moment of inertia of area× Young's modulus) of not more than 1000 [N·mm²]. Specifically, as shown in FIGS. 6 and 7, the second sealing member 4 is a substrate having a substantially rectangular parallelepiped shape (flat plate shape) that is made of crystal. A first main surface 411 (a surface to be bonded to the crystal resonator plate 2) of the second sealing member 4 is formed as a smooth flat surface (mirror finished). In this embodiment, an AT-cut crystal plate is used as the second sealing member 4 similarly to the above-described crystal resonator plate 2. The thickness of the second sealing member 4 is set in the range from 30 to 80 μm.

On the first main surface 411 of the second sealing member 4, a sealing-member-side second sealing part 42 is disposed so as to be bonded to the crystal resonator plate 2. On the sealing-member-side second sealing part 42, a sealing-member-side second bonding pattern (second metal film) 421 is formed so as to be bonded to the crystal resonator plate 2. The sealing-member-side second bonding pattern 421 is formed so as to have an annular shape in plan view, and more specifically, its outer edge and inner edge each have a substantially octagonal shape. The sealing-member-side second bonding pattern 421 is disposed so as to be close to the outer peripheral edge of the first main surface 411 of the second sealing member 4. The sealing-member-side second bonding pattern 421 has substantially the same width at all positions on the sealing-member-side second sealing part 42 of the second sealing member 4.

The sealing-member-side second bonding pattern 421 is constituted of a base PVD film 4211 deposited on the second sealing member 4 by the physical vapor deposition, and an electrode PVD film 4212 deposited on the base PVD film 4211 by the physical vapor deposition. In this embodiment, the base PVD film 4211 is made of Ti (or Cr), and the electrode PVD film 4212 is made of Au. Specifically, the sealing-member-side second bonding pattern 421 is made of a plurality of layers laminated on the sealing-member-side second sealing part 42 of a second main surface 412, that is, a Ti layer (or a Cr layer) and an Au layer are deposited by the vapor deposition in this order from the lowermost layer side.

Also, a pair of external electrode terminals (the first external electrode terminal 431 and the second external electrode terminal 432), which is electrically connected to the outside, is formed on the second main surface 412 (the outer main surface not facing the crystal resonator plate 2) of the second sealing member 4. As shown in FIGS. 1 and 7, the first external electrode terminal 431 and the second external electrode terminal 432 are located at respective end parts of the second main surface 412 of the second sealing member 4 in the longitudinal direction in plan view. The pair of external electrode terminals (the first external electrode terminal 431 and the second external electrode terminal 432) is constituted of base PVD films 4311 and 4321 deposited on the second main surface 412 by the physical vapor deposition, and electrode PVD films 4312 and 4322 respectively deposited on the base PVD films 4311 and 4321 by the physical vapor deposition. The first external electrode terminal 431 and the second external electrode terminal 432 each cover a region of not less than ¼ of the area of the second main surface 412 of the second sealing member 4.

As shown in FIGS. 1, 6 and 7, two through holes (a second through hole 45 and a third through hole 46) are formed in the second sealing member 4 so as to penetrate between the first main surface 411 and the second main surface 412. The second through hole 45 is connected to the first external electrode terminal 431 and to the connecting bonding pattern 265 of the crystal resonator plate 2. The third through hole 46 is connected to the second external electrode terminal 432 and to the connecting bonding pattern 28 of the crystal resonator plate 2.

In the second through hole 45 and the third through hole 46, through electrodes 451 and 461 are respectively formed along inner wall surfaces of the second through hole 45 and the third through hole 46 so as to establish conduction between the electrodes formed on the first main surface 411 and the second main surface 412, as shown in FIGS. 1, 6 and 7. Respective central parts of the second through hole 45 and the third through hole 46 are hollow through parts 452 and 462 penetrating between the first main surface 411 and the second main surface 412. Connecting bonding patterns 453 and 463 are formed respectively on the outer peripheral regions of the second through hole 45 and the third through hole 46.

The connecting bonding patterns 453 and 463 are provided on the first main surface 411 of the second sealing member 4 so as to be bonded, respectively, to the connecting bonding patterns 265 and 28 of the crystal resonator plate 2. The connecting bonding patterns 453 and 463 extend in the short side direction (in the X axis direction in FIG. 6) of the second sealing member 4. The connecting bonding patterns 453 and 463 are provided at a predetermined interval in the long side direction (in the Z' axis direction in FIG. 6) of the second sealing member 4. The interval between the connecting bonding patterns 453 and 463 in the Z' axis direction is substantially the same as the interval between the connecting bonding patterns 265 and 28 in the Z' axis direction of the crystal resonator plate 2 (see FIG. 5).

The connecting bonding patterns 453 and 463 have the same configuration as the sealing-member-side second bonding pattern 421, accordingly, they can be formed by the same process (for example, by sputtering) as that for the sealing-member-side second bonding pattern 421. Specifically, each of the connecting bonding patterns 453 and 463 is constituted of a base PVD film deposited on the first main surface 411 of the second sealing member 4 by the physical vapor deposition, and an electrode PVD film deposited on the base PVD film by the physical vapor deposition.

In the configuration of the crystal resonator 10, the second through hole 45, the third through hole 46, and the connecting bonding patterns 453 and 463 are formed in the inward position of the internal space 13 in plan view. The second through hole 45, the third through hole 46, and the connecting bonding patterns 453 and 463 are not electrically connected to the sealing-member-side second bonding pattern 421. Also, the first external electrode terminal 431 and the second external electrode terminal 432 are not electrically connected to the sealing-member-side second bonding pattern 421.

In the above-described crystal resonator 10 that includes the crystal resonator plate 2, the first sealing member 3 and the second sealing member 4, the diffusion bonding is performed as follows: the crystal resonator plate 2 and the first sealing member 3 are subjected to diffusion bonding in a state in which the resonator-plate-side first bonding pattern 251 and the sealing-member-side first bonding pattern 321 are superimposed on each other; and the crystal resonator plate 2 and the second sealing member 4 are subjected to the diffusion bonding in a state in which the resonator-plate-side second bonding pattern 252 and the sealing-member-side second bonding pattern 421 are superimposed on each other. Thus, the package 12 having the sandwich structure as shown in FIG. 1 is produced. In contrast to the conventional art, no special bonding material, such as an adhesive, is needed separately. Thus, the internal space 13 of the package 12, i.e. the space for housing the vibrating part 22 is hermetically sealed.

Figure 8:
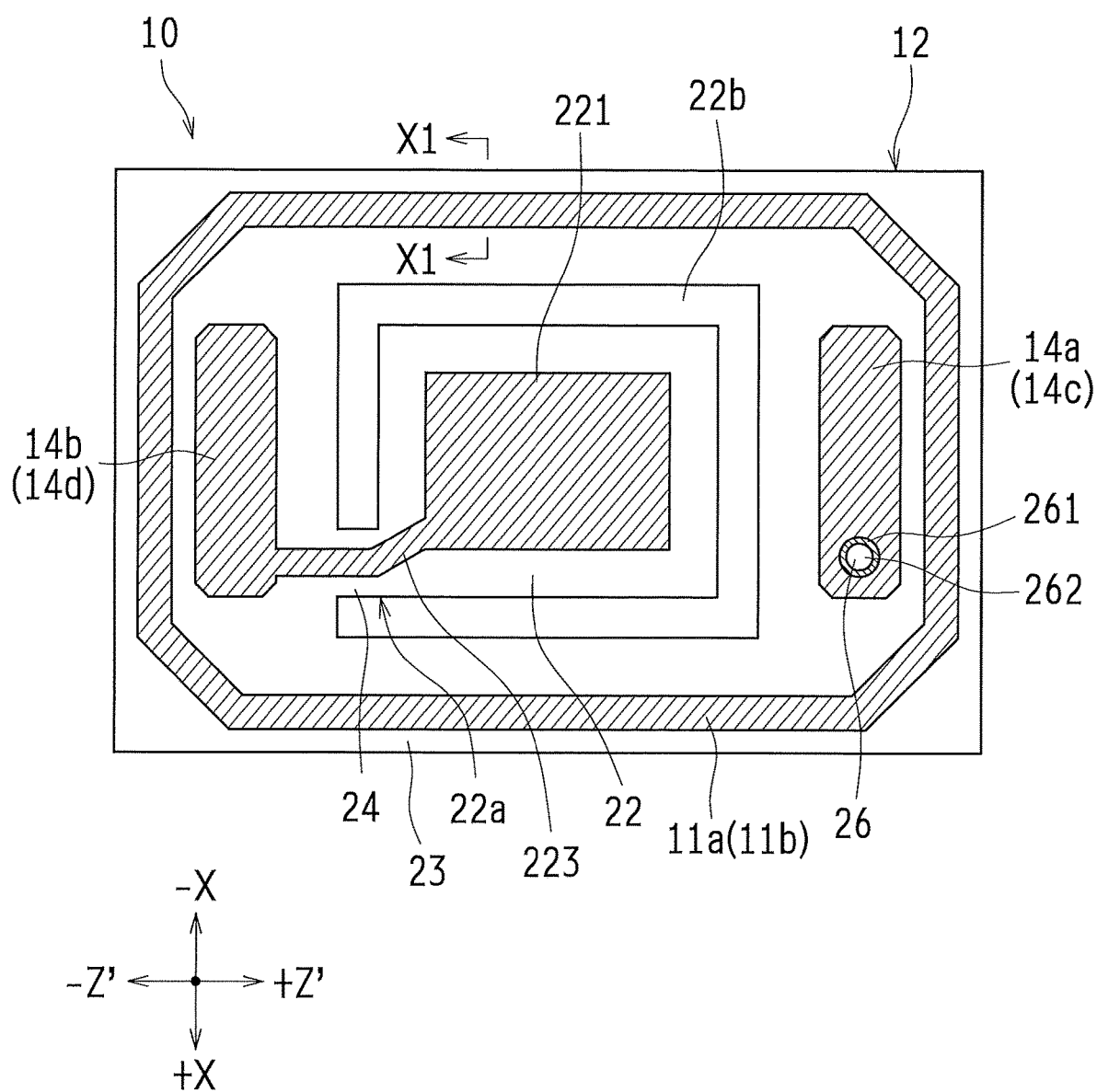
FIG. 8 is a diagram illustrating a positional relationship in plan view between a vibrating part and a sealing part of the crystal resonator.

Then, the resonator-plate-side first bonding pattern 251 and the sealing-member-side first bonding pattern 321 themselves serve as the bonding material (sealing bonding material) 11a formed upon the diffusion bonding. The crystal resonator plate 2 and the first sealing member 3 are thus bonded to each other by the bonding material 11a. The resonator-plate-side second bonding pattern 252 and the sealing-member-side second bonding pattern 421 themselves serve as the bonding material (sealing bonding material) 11b formed upon the diffusion bonding. The crystal resonator plate 2 and the second sealing member 4 are thus bonded to each other by the bonding material 11b. As shown in FIG. 8, the bonding materials 11a and 11b are each formed so as to have an annular shape in plan view, with their outer edges and inner edges each having a substantially octagonal shape. The bonding materials 11a and 11b are respectively formed so as to be located at substantially the same position in plan view. More specifically, the respective inner peripheral edges of the bonding materials 11a and 11b are formed so as to be located at substantially the same position while the respective outer peripheral edges of the bonding materials 11a and 11b are formed so as to be located at substantially the same position. In addition, it is possible to improve bond strength of the bonding materials 11a and 11b by bonding the respective bonding patterns in the pressurized state.

In this embodiment, the wiring from the first and the second excitation electrodes 221 and 222 of the crystal resonator plate 2 to the first external electrode terminal 431 and the second external electrode terminal 432 is completely formed inside the bonding materials (sealing bonding materials) 11a and 11b that serve as the sealing parts in plan view, as shown in FIG. 8. The outer edges and inner edges of the bonding materials 11a and 11b are each formed so as to have a substantially octagonal shape in plan view. Also, the bonding materials 11a and 11b are formed so as to be close to the outer peripheral edge of the package 12 in plan view. In this way, it is possible to increase the size of the vibrating part 22 of the crystal resonator plate 2. The distance between the inner peripheral edges of the bonding materials 11a and 11b and the space 22b disposed between the vibrating part 22 and the external frame part 23 is larger on the short side of the package 12 than on the long side thereof.

At this time, the respective connecting bonding patterns as described above are also subjected to the diffusion bonding in a state in which they are each superimposed on the corresponding connecting bonding pattern. Specifically, the connecting bonding pattern 264 of the crystal resonator plate 2 and the connecting bonding pattern 35 of the first sealing member 3 are subjected to the diffusion bonding. The connecting bonding pattern 27 of the crystal resonator plate 2 and the connecting bonding pattern 36 of the first sealing member 3 are subjected to the diffusion bonding. The connecting bonding pattern 265 of the crystal resonator plate 2 and the connecting bonding pattern 453 of the second sealing member 4 are subjected to the diffusion bonding. The connecting bonding pattern 28 of the crystal resonator plate 2 and the connecting bonding pattern 463 of the second sealing member 4 are subjected to the diffusion bonding.

Then, the connecting bonding pattern 264 and the connecting bonding pattern 35 themselves serve as a bonding material 14a formed upon the diffusion bonding. The crystal resonator plate 2 and the first sealing member 3 are thus bonded to each other by the bonding material 14a. The connecting bonding pattern 27 and the connecting bonding pattern 36 themselves serve as a bonding material 14b formed upon the diffusion bonding. The crystal resonator plate 2 and the first sealing member 3 are thus bonded to each other by the bonding material 14b. Also, the connecting bonding pattern 265 and the connecting bonding pattern 453 themselves serve as a bonding material 14c formed upon the diffusion bonding. The crystal resonator plate 2 and the second sealing member 4 are thus bonded to each other by the bonding material 14c. The connecting bonding pattern 28 and the connecting bonding pattern 463 themselves serve as a bonding material 14d formed upon the diffusion bonding. The crystal resonator plate 2 and the second sealing member 4 are thus bonded to each other by the bonding material 14d. The bonding materials 14a to 14d serve to establish conduction between the through electrodes of the through holes and the bonding materials 14a to 14d, and to hermetically seal the bonding parts. Since the bonding materials 14a to 14d are formed inside the bonding materials 11a and 11b as the sealing parts in plan view, they are shown by the broken line in FIG. 1.

In the package 12 produced as described above, a gap between the first sealing member 3 and the crystal resonator plate 2 is not more than 1.00 μm. A gap between the second sealing member 4 and the crystal resonator plate 2 is not more than 1.00 μm. That is, the thickness of the bonding material 11a between the first sealing member 3 and the crystal resonator plate 2 is not more than 1.00 μm, and the thickness of the bonding material 11b between the second sealing member 4 and the crystal resonator plate 2 is not more than 1.00 μm (specifically, the thickness in the Au—Au bonding of this embodiment is 0.15 to 1.00 μm). As a comparative example, the conventional metal paste sealing material containing Sn has a thickness of 5 to 20 μm.

Here, the first through hole 26 and the second through hole 45 are disposed so as to not be superimposed on each other in plan view. Specifically, as shown in FIG. 6, the first through hole 26 and the second through hole 45 are vertically linearly arranged in front view (i.e. when viewed from the X axis direction in FIG. 6). For convenience sake, in FIG. 6, the first through hole 26 formed in the crystal resonator plate 2 disposed above the second sealing member 4 is shown by the dashed double-dotted line. On the other hand, the first through hole 26 and the second through hole 45 are offset from each other so as to not be vertically linearly arranged in side view (i.e. when viewed from the Z' axis direction in FIG. 6). More specifically, the first through hole 26 is connected to one end part of the bonding material 14 (the connecting bonding patterns 265 and 453) in the longitudinal direction thereof (in the X axis direction), and the second through hole 45 is connected to the other end part of the bonding material 14 in the longitudinal direction thereof. Thus, the through electrode 261 of the first through hole 26 is electrically connected to the through electrode 451 of the second through hole 45 via the bonding material 14. In this way, by arranging the first through hole 26 and the second through hole 45 so as to not be superimposed on each other in plan view, it is possible to ensure the hermeticity of the internal space 13 in which the vibrating part 22 of the crystal resonator plate 2 is hermetically sealed without the necessity of filling the through part 262 of the first through hole 26 and the through part 452 of the second through hole 45 with a metal and the like.

In the crystal resonator 10 of this embodiment, the respective bonding materials (sealing bonding materials) 11a and 11b serve as the sealing parts to hermetically seal the vibrating part 22 causing piezoelectric resonance. Inner peripheral edge parts 111a and 111b, and outer peripheral edge parts 112a and 112b of the respective bonding materials 11a and 11b are formed denser than intermediate parts 113a and 113b formed respectively between the inner peripheral edge part 111a and the outer peripheral edge part 112a and between the inner peripheral edge part 111b and the outer peripheral edge part 112b. Hereinafter, a description on such a configuration will be given with reference to FIGS. 8 and 9.

Figure 9:
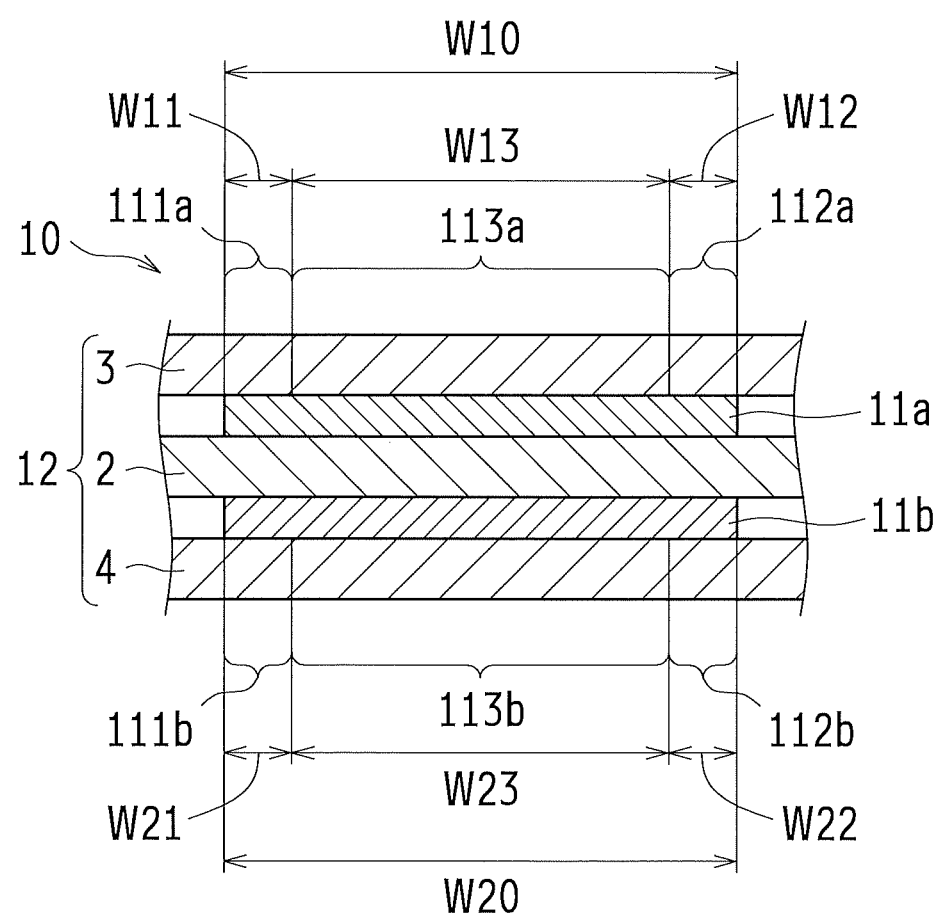
FIG. 9 is a cross-sectional view taken from line X1-X1 of FIG. 8.

As shown in FIGS. 8 and 9, the annular bonding material 11a is interposed between the crystal resonator plate (first member) 2 and the first sealing member (second member) 3, and the annular bonding material 11b is interposed between the crystal resonator plate (first member) 2 and the second sealing member (second member) 4. As described above, a gap between the crystal resonator plate 2 and the first sealing member 3 is not more than 1.00 μm. A gap between the crystal resonator plate 2 and the second sealing member 4 is not more than 1.00 μm. Also, the first sealing member 3 and the second sealing member 4 are each made of a brittle material such as crystal. The thickness of the first sealing member 3 and the second sealing member 4 is set in the range from 30 to 80 μm.

The bonding materials 11a and 11b respectively include, in plan view: the annular inner peripheral edge parts 111a and 111b positioned innermost; the annular outer peripheral edge parts 112a and 112b positioned outermost; and the annular intermediate parts 113a and 113b positioned respectively between the inner peripheral edge part 111a and the outer peripheral edge part 112a and between the inner peripheral edge part 111b and the outer peripheral edge part 112b. The intermediate parts 113a and 113b are provided adjacent respectively to the outer peripheral sides of the inner peripheral edge parts 111a and 111b, and the outer peripheral edge parts 112a and 112b are provided adjacent respectively to the outer peripheral sides of the intermediate parts 113a and 113b.

The respective widths W 10 and W 20 of the bonding materials 11a and 11b are in the range from 30 to 60 μm. The respective widths W 11 and W 21 of the inner peripheral edge parts 111a and 111b, and also the respective widths W 12 and W 22 of the outer peripheral edge parts 112a and 112b are in the range from 3 to 5 μm. The respective widths W 13 and W 23 of the intermediate parts 113a and 113b are in the range from 20 to 54 μm.

In this embodiment, the inner peripheral edge parts 111a and 111b as well as the outer peripheral edge parts 112a and 112b of the bonding materials 11a and 11b are formed denser than the intermediate parts 113a and 113b, that is, they are formed so as to include a relatively small number of voids generated inside the bonding material. Conversely, the intermediate parts 113a and 113b are formed sparser than the inner peripheral edge parts 111a and 111b and the outer peripheral edge parts 112a and 112b, that is, they are formed so as to include a relatively large number of voids generated inside the bonding material.

In this way, it is possible to improve the hermeticity of the bonding materials 11a and 11b that seal the vibrating part 22 causing piezoelectric resonance by disposing a plurality of (in this example, two) dense bonding regions in the bonding materials 11a and 11b, in particular, by disposing the inner peripheral edge parts 111a and 111b and the outer peripheral edge parts 112a and 112b. Hereinafter, a description on the above will be given.

The inner peripheral edge parts 111a and 111b and the outer peripheral edge parts 112a and 112b, which are the dense bonding regions including a relatively small number of voids, are formed to each have an annular shape. This means that the vibrating part 22 is doubly sealed by the inner and outer peripheral edge parts. Therefore, in this embodiment, it is possible to improve the hermeticity of the bonding materials 11a and 11b compared to the cases in which: no dense bonding region is provided; the dense bonding region is not formed to have an annular shape; or only one annular and dense bonding region is formed. Especially as shown in this embodiment, in the bonding materials 11a and 11b, the inner peripheral edge parts 111a and 111b and the outer peripheral edge parts 112a and 112b, which are the regions that make direct contact respectively with the inner and outer spaces of the package 12 (specifically, the internal space 13 of the package 12 and the space outside the package 12), are in the dense state. This is an effective configuration to further improve the hermeticity even when the bonding area is not large. By increasing the widths W 13 and W 23 of the intermediate parts 113a and 113b of the bonding materials 11a and 11b, the bonding area can be enlarged, which improves the bond strength of the bonding materials 11a and 11b.

Here, by forming the bonding materials 11a and 11b in the pressurized state, it is possible to form the inner peripheral edge parts 111a and 111b and the outer peripheral edge parts 112a and 112b of the bonding materials 11a and 11b in a further dense state, i.e. in the state including a smaller number of voids than the case in which the bonding materials 11a and 11b are not pressurized to be formed. Thus, the hermeticity of the bonding materials 11a and 11b can be further improved. Also, in this embodiment, the gap between the crystal resonator plate 2 and the first sealing member 3 (1.00 μm or less) and the gap between the crystal resonator plate 2 and the second sealing member 4 (1.00 μm or less) are set to 0.1 times or less the thickness of the first sealing member 3 and the second sealing member 4 (30 to 80 μm). In this way, when the bonding materials 11a and 11b are bonded in the pressurized state, it is possible to form the inner peripheral edge parts 111a and 111b and the outer peripheral edge parts 112a and 112b of the bonding materials 11a and 11b in a further dense state, which further improves the hermeticity of the bonding materials 11a and 11b.

The position of the outer peripheral edge of the resonator-plate-side first bonding pattern 251 of the crystal resonator plate 2 may differ from the position of the outer peripheral edge of the sealing-member-side first bonding pattern 321 of the first sealing member 3 in plan view. Also, the position of the outer peripheral edge of the resonator-plate-side second bonding pattern 252 of the crystal resonator plate 2 may differ from the position of the outer peripheral edge of the sealing-member-side second bonding pattern 421 of the second sealing member 4 in plan view. Similarly to the above, the position of the inner peripheral edge of the resonator-plate-side first bonding pattern 251 of the crystal resonator plate 2 may differ from the position of the inner peripheral edge of the sealing-member-side first bonding pattern 321 of the first sealing member 3 in plan view. Also, the position of the inner peripheral edge of the resonator-plate-side second bonding pattern 252 of the crystal resonator plate 2 may differ from the position of the inner peripheral edge of the sealing-member-side second bonding pattern 421 of the second sealing member 4 in plan view. In these cases, the width of the resonator-plate-side first bonding pattern 251 of the crystal resonator plate 2 may differ from the width of the sealing-member-side first bonding pattern 321 of the first sealing member 3. Also, the width of the resonator-plate-side second bonding pattern 252 of the crystal resonator plate 2 may differ from the width of the sealing-member-side second bonding pattern 421 of the second sealing member 4.

With the above-described configuration, it is possible to absorb the lamination displacement (position displacement) that is generated when the crystal resonator plate 2, the first sealing member 3 and the second sealing member 4 are laminated and bonded. Accordingly, even when such a lamination displacement is generated, it is possible to form the inner peripheral edge parts 111a and 111b and the outer peripheral edge parts 112a and 112b of the bonding materials 11a and 11b in the dense state. The crystal resonator plate 2 is required to ensure the region on which are provided the first and second excitation electrodes 221 and 222, and furthermore the first and second extraction electrodes 223 and 224. Thus, taking into account the easiness in pattern formation or the downsizing of the package 12, it is preferable to set the width of the resonator-plate-side first bonding pattern 251 of the crystal resonator plate 2 larger than the width of the sealing-member-side first bonding pattern 321 of the first sealing member 3. Similarly to the above, it is preferable to set the width of the resonator-plate-side second bonding pattern 252 of the crystal resonator plate 2 larger than the width of the sealing-member-side second bonding pattern 421 of the second sealing member 4.

Also, in the case where the first sealing member 3 and the second sealing member 4 are made of crystal, the crystal resonator plate 2, the first sealing member 3 and the second sealing member 4 have the same coefficient of thermal expansion, which makes possible to prevent deformation of package 12 caused by difference in the coefficient of thermal expansion among the crystal resonator plate 2, the first sealing member 3 and the second sealing member 4. Thus, it is possible to improve the hermeticity of the internal space 13 in which is hermetically sealed the vibrating part 22 of the crystal resonator plate 2. Also, distortion of the package 12 due to the deformation is transmitted to the first excitation electrode 221 and the second excitation electrode 222 via the connecting part 24, which may cause frequency variations. However, it is possible to reduce such frequency variations by use of the crystal resonator plate 2, the first sealing member 3 and the second sealing member 4, all of which are made of crystal.

Next, a variation of the crystal resonator according to this embodiment will be described.

Figure 16:
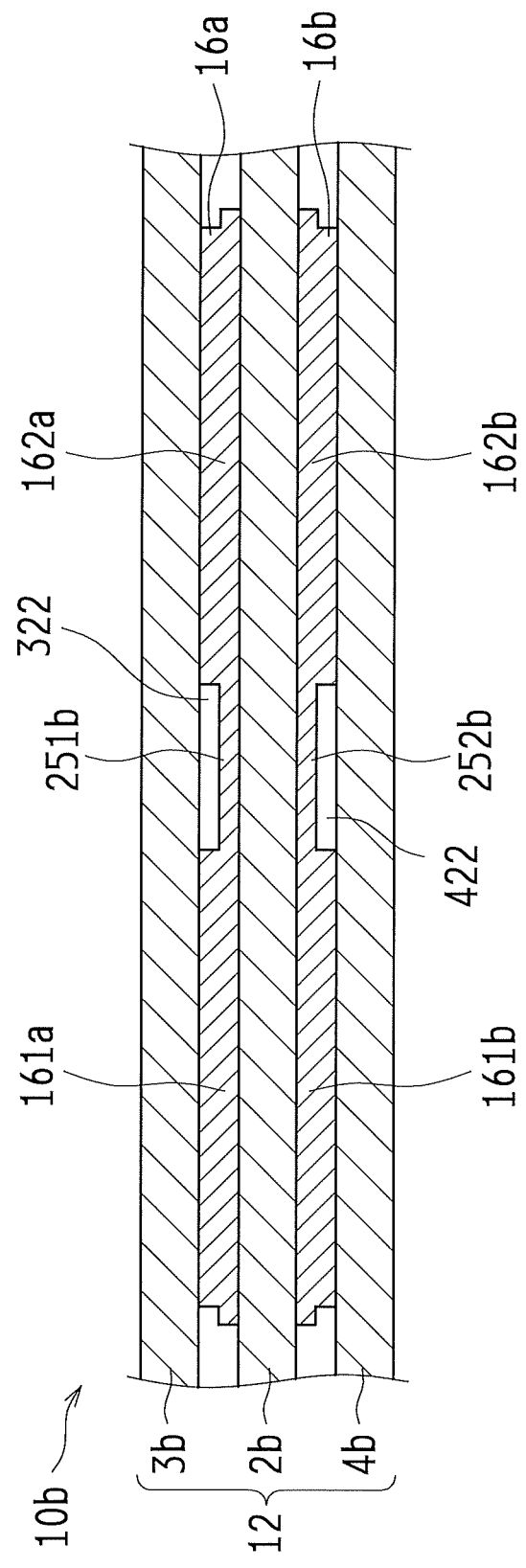
FIG. 16 is a diagram of the crystal resonator according to Variation 2, which corresponds to FIG. 9.
Figure 17:
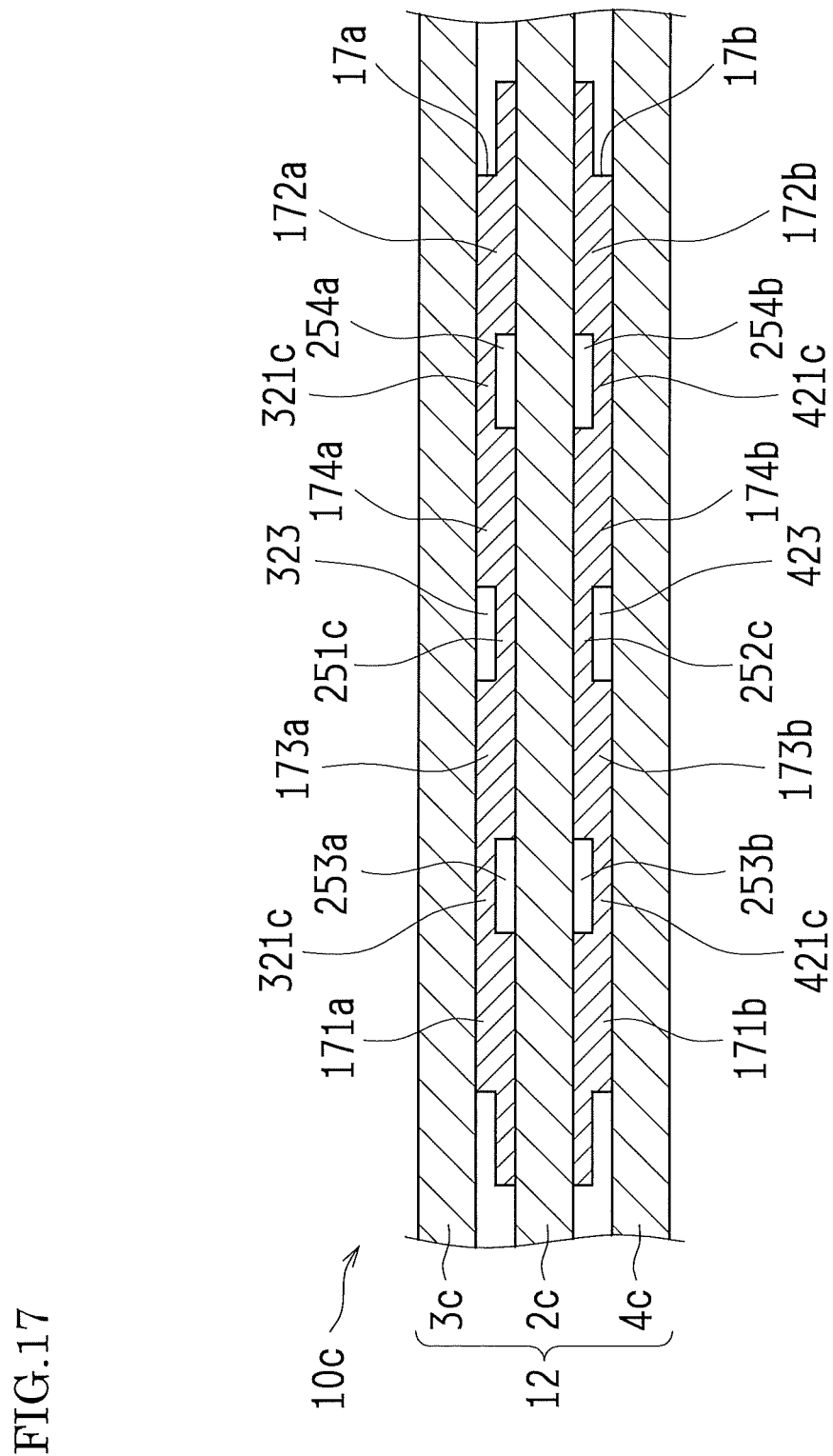
FIG. 17 is a diagram of the crystal resonator according to Variation 3, which corresponds to FIG. 9.

FIGS. 10 to 15 indicate a crystal resonator 10a according to Variation 1. FIG. 16 indicates a crystal resonator 10b according to Variation 2. FIG. 17 indicates a crystal resonator 10c according to Variation 3.

In the crystal resonator 10a according to Variation 1 shown in FIGS. 10 to 15, the respective bonding materials (sealing bonding materials) 15a and 15b serve as the sealing parts to hermetically seal the vibrating part 22 causing piezoelectric resonance. The bonding materials 15a and 15b are formed so as to be divided, respectively, into inner peripheral side bonding materials (inner peripheral side sealing bonding materials) 151a and 151b, and outer peripheral side bonding materials (outer peripheral side sealing bonding materials) 152a and 152b. That is, the bonding materials 15a and 15b each have a double structure constituted of an inner bonding material and an outer bonding material. For convenience sake, the common configuration with the crystal resonator 10 of the above embodiment (see FIGS. 1 to 9) is indicated by the same reference numerals, and the description thereof is omitted. Hereinafter, a description will be given mainly on the configuration of the crystal resonator 10a according to this Variation, which differs from the configuration of the crystal resonator 10 of the above embodiment.

Figure 11:
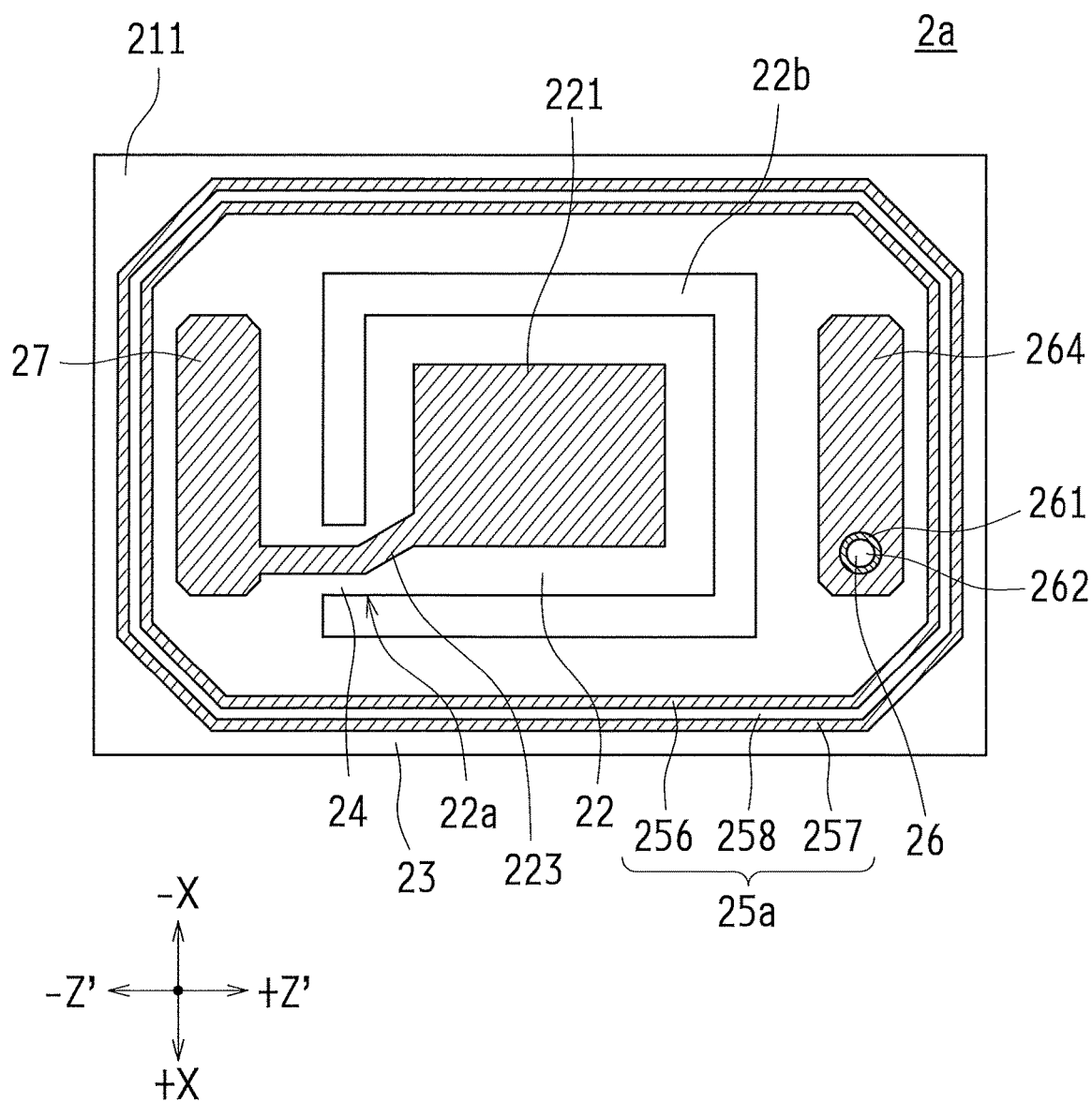
FIG. 11 is a schematic plan view illustrating the variation of the crystal resonator plate of the crystal resonator.
Figure 12:
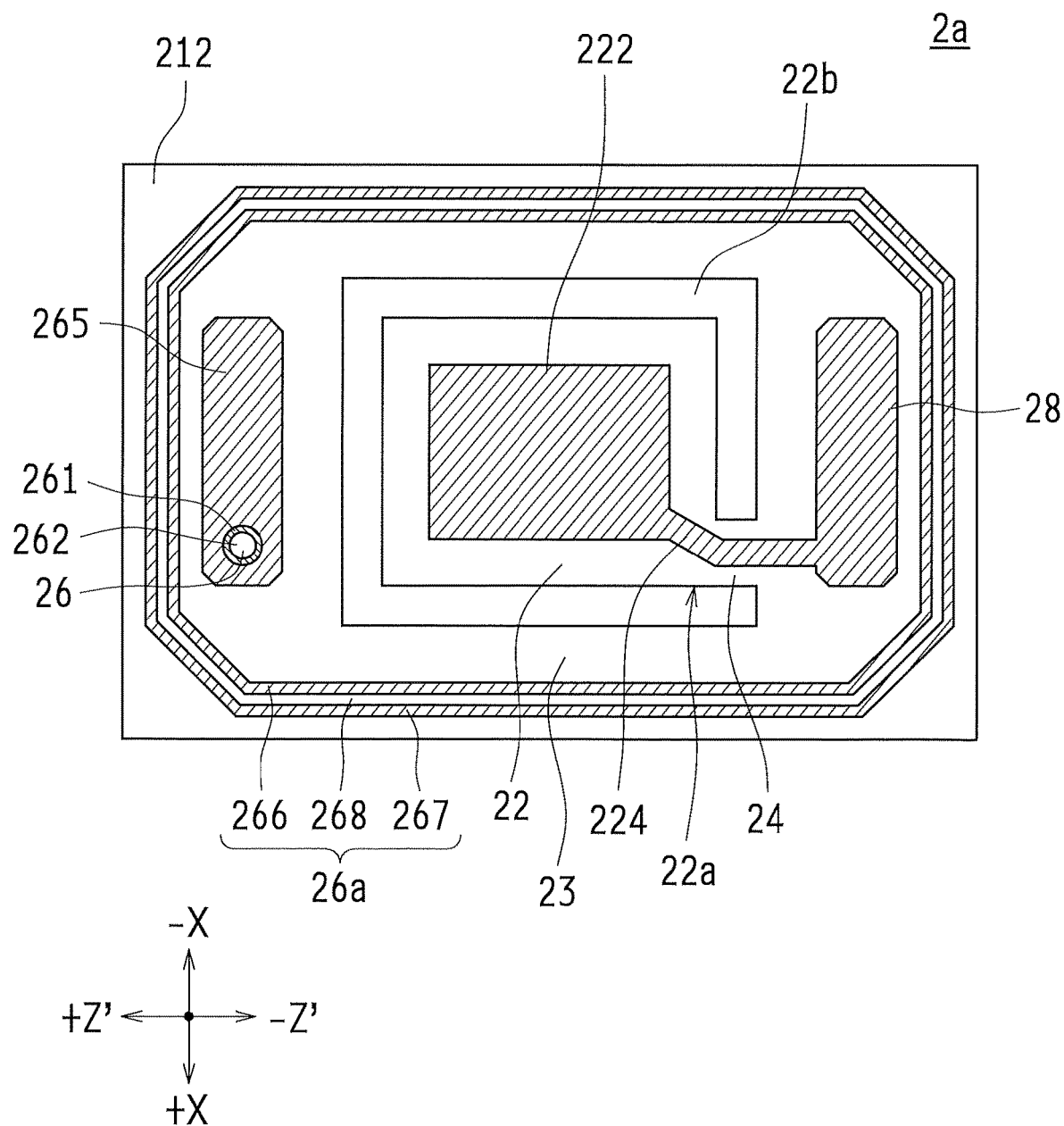
FIG. 12 is a schematic rear view illustrating the variation of the crystal resonator plate of the crystal resonator.

As shown in FIG. 11, a resonator-plate-side first bonding pattern (first metal film) 25a is formed on the first main surface 211 of a crystal resonator plate 2a so as to be divided, by an annular slit 258, into a resonator-plate-side first inner bonding pattern (inner peripheral side metal film) 256 and a resonator-plate-side first outer bonding pattern (outer peripheral side metal film) 257. As shown in FIG. 12, a resonator-plate-side second bonding pattern (first metal film) 26a is formed on the second main surface 212 of the crystal resonator plate 2a so as to be divided, by an annular slit 268, into a resonator-plate-side second inner bonding pattern (inner peripheral side metal film) 266 and a resonator-plate-side second outer bonding pattern (outer peripheral side metal film) 267.

The resonator-plate-side first bonding pattern 25a and the resonator-plate-side second bonding pattern 26a are each formed on the external frame part 23 of the crystal resonator plate 2a. The pair of first excitation electrode 221 and second excitation electrode 222 of the crystal resonator plate 2a is not electrically connected to the resonator-plate-side first bonding pattern 25a and the resonator-plate-side second bonding pattern 26a. Similarly to the above embodiment, the resonator-plate-side first bonding pattern 25a and the resonator-plate-side second bonding pattern 26a are each constituted of a base PVD film and an electrode PVD film formed by, for example, sputtering. The base PVD film is made of Ti (or Cr), and the electrode PVD film is made of Au.

The resonator-plate-side first inner bonding pattern 256 and the resonator-plate-side first outer bonding pattern 257 are each formed so as to have an annular shape in plan view, with their respective outer edges and inner edges each having a substantially octagonal shape. The resonator-plate-side first inner bonding pattern 256 and the resonator-plate-side first outer bonding pattern 257 have substantially the same width on their entire circumferences. The resonator-plate-side second inner bonding pattern 266 and the resonator-plate-side first outer bonding pattern 267 are each formed so as to have an annular shape in plan view, with their respective outer edges and inner edges each having a substantially octagonal shape. The resonator-plate-side second inner bonding pattern 266 and the resonator-plate-side first outer bonding pattern 267 have substantially the same width on their entire circumferences.

Figure 10:
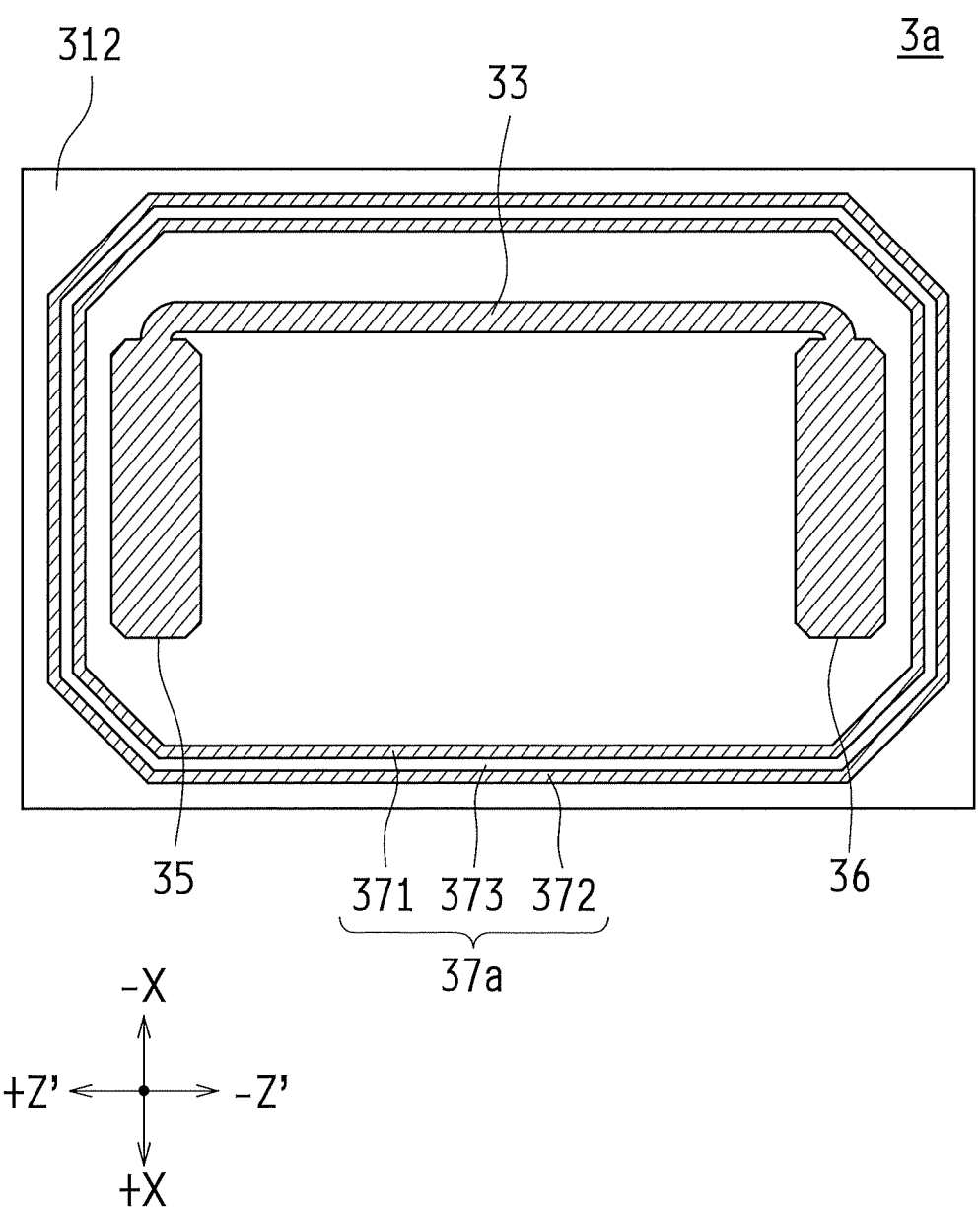
FIG. 10 is a schematic rear view illustrating a variation of the first sealing member of the crystal resonator.

As shown in FIG. 10, a sealing-member-side first bonding pattern (second metal film) 37a is formed on the second main surface 312 of a first sealing member 3a so as to be divided, by an annular slit 373, into a sealing-member-side first inner bonding pattern (inner peripheral side metal film) 371 and a sealing-member-side first outer bonding pattern (outer peripheral side metal film) 372. Similarly to the above embodiment, the sealing-member-side first inner bonding pattern 371 and the sealing-member-side first outer bonding pattern 372 are each constituted of a base PVD film and an electrode PVD film formed by, for example, sputtering. The base PVD film is made of Ti (or Cr), and the electrode PVD film is made of Au. The sealing-member-side first inner bonding pattern 371 and the sealing-member-side first outer bonding pattern 372 are each formed so as to have an annular shape in plan view, with their respective outer edges and inner edges each having a substantially octagonal shape. The sealing-member-side first inner bonding pattern 371 and the sealing-member-side first outer bonding pattern 372 have substantially the same width on their entire circumferences.

Figure 13:
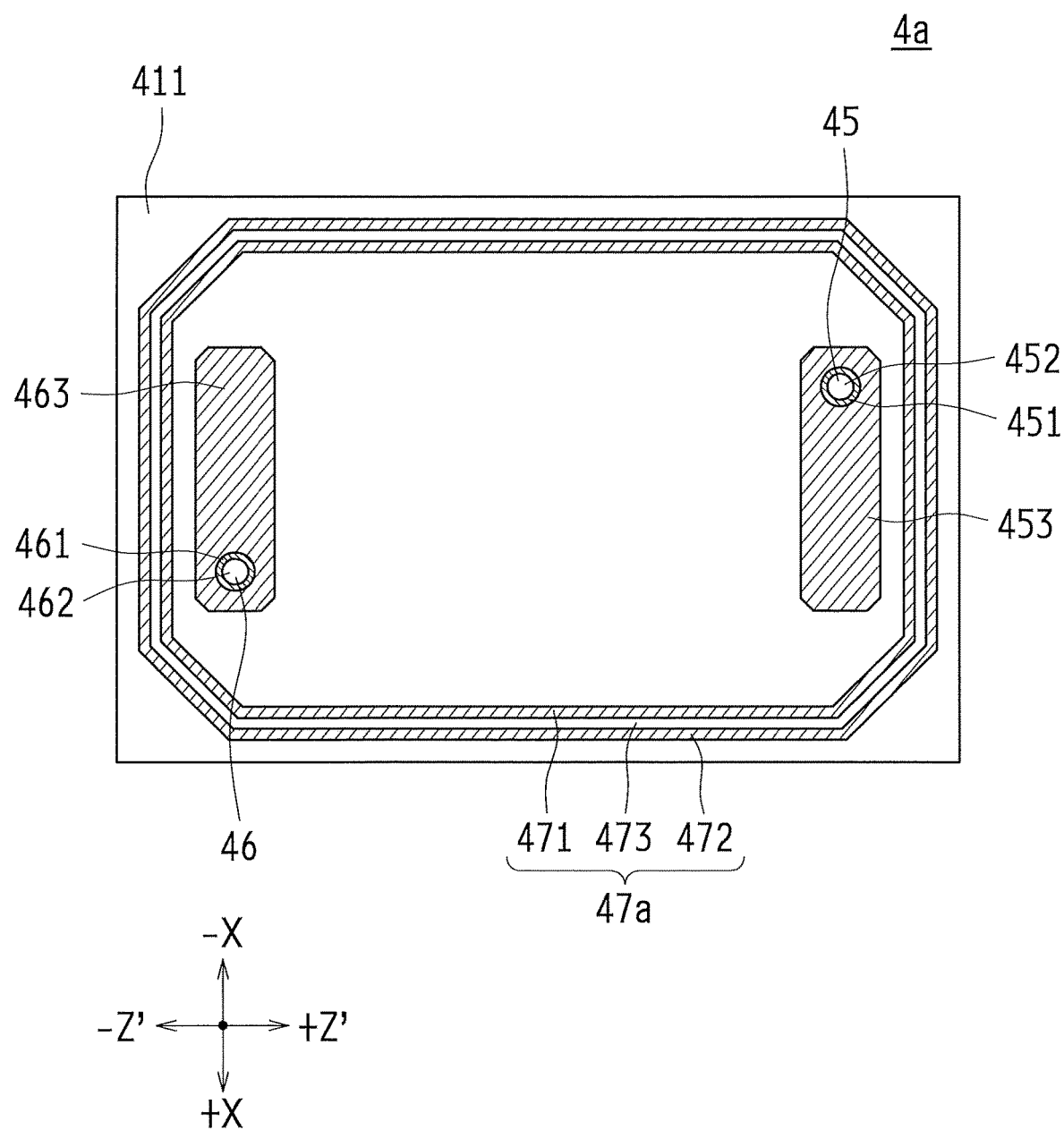
FIG. 13 is a schematic plan view illustrating the variation of the second sealing member of the crystal resonator.

As shown in FIG. 13, a sealing-member-side second bonding pattern (second metal film) 47a is formed on the first main surface 411 of a second sealing member 4a so as to be divided, by an annular slit 473, into a sealing-member-side second inner bonding pattern (inner peripheral side metal film) 471 and a sealing-member-side second outer bonding pattern (outer peripheral side metal film) 472. Similarly to the above embodiment, the sealing-member-side second inner bonding pattern 471 and the sealing-member-side second outer bonding pattern 472 are each constituted of the base PVD film and the electrode PVD film formed by, for example, sputtering. The base PVD film is made of Ti (or Cr), and the electrode PVD film is made of Au. The sealing-member-side second inner bonding pattern 471 and the sealing-member-side second outer bonding pattern 472 are each formed so as to have an annular shape in plan view, with their respective outer edges and inner edges each having a substantially octagonal shape. The sealing-member-side second inner bonding pattern 471 and the sealing-member-side second outer bonding pattern 472 have substantially the same width on their entire circumferences.

Similarly to the above embodiment, in the crystal resonator 10a that includes the crystal resonator plate 2a, the first sealing member 3a and the second sealing member 4a, the diffusion bonding is performed as follows: the crystal resonator plate 2a and the first sealing member 3a are subjected to the diffusion bonding in a state in which the resonator-plate-side first bonding pattern 25a and the sealing-member-side first bonding pattern 37a are superimposed on each other; and the crystal resonator plate 2a and the second sealing member 4a are subjected to the diffusion bonding in a state in which the resonator-plate-side second bonding pattern 26a and the sealing-member-side second bonding pattern 47a are superimposed on each other. Thus, the package 12 having the sandwich structure is produced. Accordingly, the internal space 13 of the package 12, i.e. the space for housing the vibrating part 22 is hermetically sealed.

Then, the resonator-plate-side first bonding pattern 25a and the sealing-member-side first bonding pattern 37a themselves serve as the bonding material 15a formed upon the diffusion bonding. The crystal resonator plate 2a and the first sealing member 3a are thus bonded to each other by the bonding material 15a. More specifically, the resonator-plate-side first inner bonding pattern 256 and the sealing-member-side first inner bonding pattern 371 themselves serve as the annular-shaped inner peripheral side bonding material 151a formed upon the diffusion bonding. The resonator-plate-side first outer bonding pattern 257 and the sealing-member-side first outer bonding pattern 372 themselves serve as the annular-shaped outer peripheral side bonding material 152a formed upon the diffusion bonding. An annular space (slit) 153a is formed between the bonding materials 151a and 152a by the slits 258 and 373.

Also, the resonator-plate-side second bonding pattern 26a and the sealing-member-side second bonding pattern 47a themselves serve as the bonding material 15b formed upon the diffusion bonding. The crystal resonator plate 2a and the second sealing member 4a are thus bonded to each other by the bonding material 15b. More specifically, the resonator-plate-side second inner bonding pattern 266 and the sealing-member-side second inner bonding pattern 471 themselves serve as the annular-shaped inner peripheral side bonding material 151b formed upon the diffusion bonding. The resonator-plate-side second outer bonding pattern 267 and the sealing-member-side second outer bonding pattern 472 themselves serve as the annular-shaped outer peripheral side bonding material 152b formed upon the diffusion bonding. An annular space (slit) 153b is formed between the bonding materials 151b and 152b by the slits 268 and 473.

The bonding materials 151a, 151b, 152a and 152b are each formed so as to have an annular shape in plan view, with their respective outer edges and inner edges each having a substantially octagonal shape. The inner peripheral side bonding materials 151a and 151b are respectively formed so as to be located at substantially the same position in plan view. The outer peripheral side bonding materials 152a and 152b are respectively formed so as to be located at substantially the same position in plan view.

Figure 14:
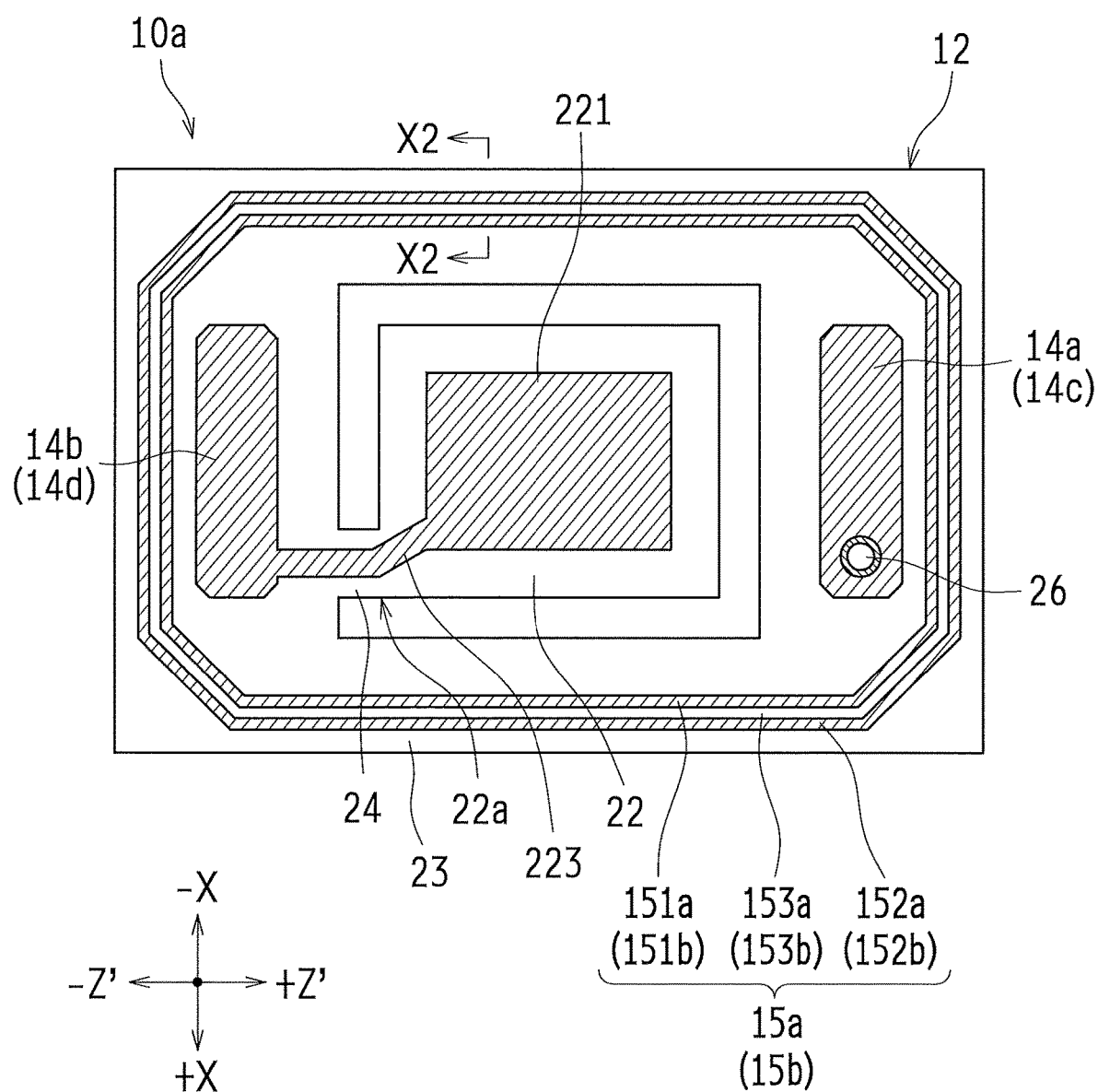
FIG. 14 is a diagram illustrating a positional relationship in plan view between the vibrating part and the sealing part of the crystal resonator according to Variation 1.
Figure 15:
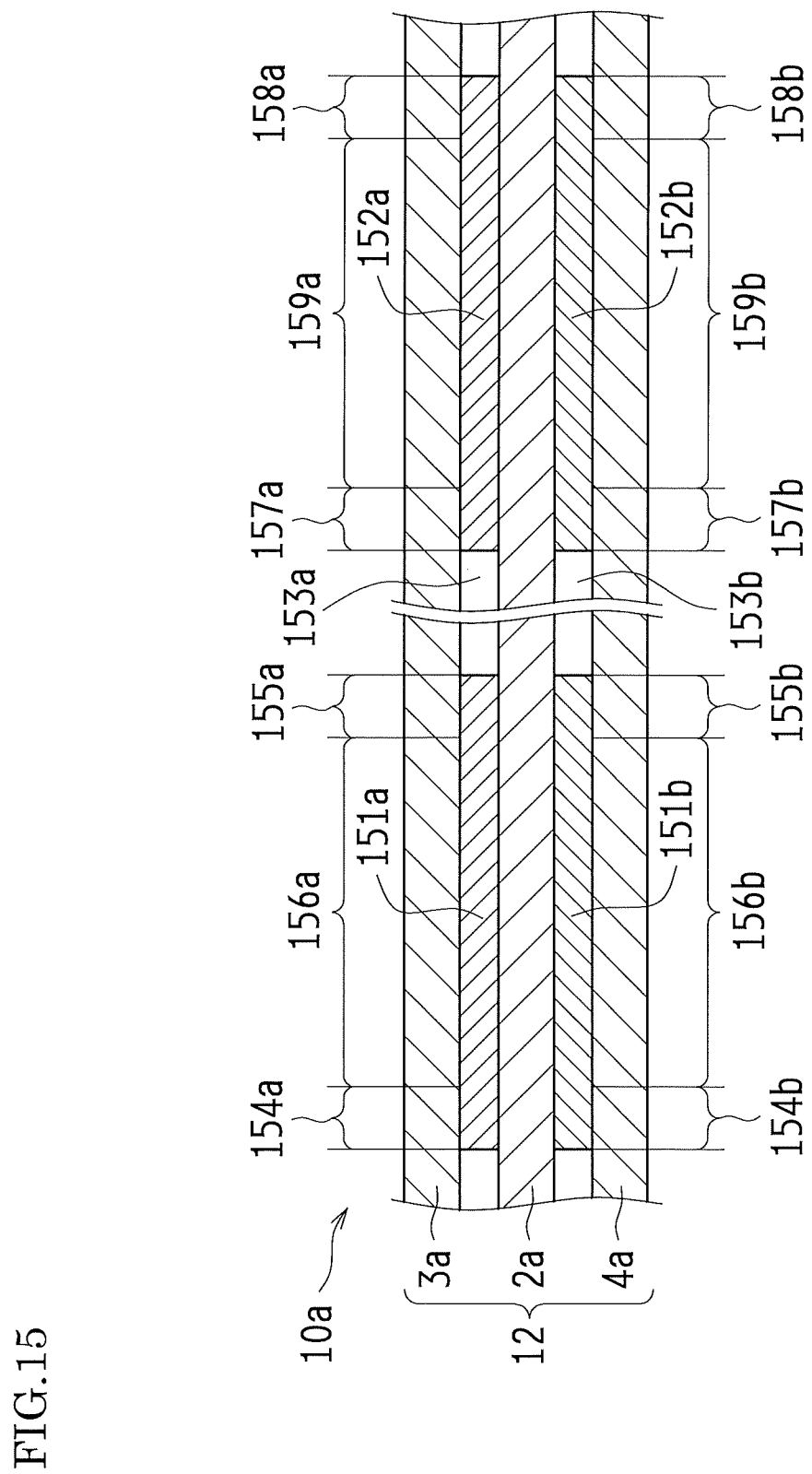
FIG. 15 is a cross-sectional view taken from line X2-X2 of FIG. 14.

In crystal resonator 10a of this Variation, as shown in FIGS. 14 and 15, the annular bonding materials 151a and 152a are interposed between the crystal resonator plate 2a and the first sealing member 3a, and the annular bonding materials 151b and 152b are interposed between the crystal resonator plate 2a and the second sealing member 4a. A gap between the crystal resonator plate 2a and the first sealing member 3a is not more than 1.00 μm. A gap between the crystal resonator plate 2a and the second sealing member 4a is not more than 1.00 μm. Also, the first sealing member 3a and the second sealing member 4a are each made of a brittle material such as crystal. The thickness of the first sealing member 3a and the second sealing member 4a is set in the range from 30 to 80 μm.

The inner peripheral side bonding materials 151a and 151b respectively include, in plan view: annular inner peripheral edge parts 154a and 154b positioned innermost; annular outer peripheral edge parts 155a and 155b positioned outermost; and annular intermediate parts 156a and 156b positioned respectively between the inner peripheral edge part 154a and the outer peripheral edge part 155a and between the inner peripheral edge part 154b and the outer peripheral edge part 155b. The intermediate parts 156a and 156b are provided adjacent respectively to the outer peripheral sides of the inner peripheral edge parts 154a and 154b, and the outer peripheral edge parts 155a and 155b are provided adjacent respectively to the outer peripheral sides of the intermediate parts 156a and 156b.

In this Variation, the inner peripheral edge parts 154a and 154b as well as the outer peripheral edge parts 155a and 155b of the inner peripheral side bonding materials 151a and 151b are formed denser than the intermediate parts 156a and 156b, that is, they are formed so as to include a relatively small number of voids generated inside the bonding material. Conversely, the intermediate parts 156a and 156b are formed sparser than the inner peripheral edge parts 154a and 154b and the outer peripheral edge parts 155a and 155b, that is, they are formed so as to include a relatively large number of voids generated inside the bonding material.

The outer peripheral side bonding materials 152a and 152b respectively include, in plan view: annular inner peripheral edge parts 157a and 157b positioned innermost; annular outer peripheral edge parts 158a and 158b positioned outermost; and annular intermediate parts 159a and 159b positioned respectively between the inner peripheral edge part 157a and the outer peripheral edge part 158a and between the inner peripheral edge part 157b and the outer peripheral edge part 158b. The intermediate parts 159a and 159b are provided adjacent respectively to the outer peripheral sides of the inner peripheral edge parts 157a and 157b, and the outer peripheral edge parts 158a and 158b are provided adjacent respectively to the outer peripheral sides of the intermediate parts 159a and 159b.

In this Variation, the inner peripheral edge parts 157a and 157b as well as the outer peripheral edge parts 158a and 158b of the outer peripheral side bonding materials 152a and 152b are formed denser than the intermediate parts 159a and 159b, that is, they are formed so as to include a relatively small number of voids generated inside the bonding material. Conversely, the intermediate parts 159a and 159b are formed sparser than the inner peripheral edge parts 157a and 157b and the outer peripheral edge parts 158a and 158b, that is, they are formed so as to include a relatively large number of voids generated inside the bonding material.

In this way, it is possible to improve the hermeticity of the bonding materials 15a and 15b that seal the vibrating part 22 causing piezoelectric resonance by disposing a plurality of (in this example, four) dense bonding regions in the bonding materials 15a and 15b (the inner peripheral side bonding materials 151a and 151b, and the outer peripheral side bonding materials 152a and 152b), in particular, by disposing the inner peripheral edge parts 154a and 154b, and 157a and 157b, and the outer peripheral edge parts 155a and 155b, and 158a and 158b. That is, the inner peripheral edge parts 154a and 154b, and 157a and 157b, and the outer peripheral edge parts 155a and 155b, and 158a and 158b, which are dense bonding regions including a relatively small number of voids, are formed to each have an annular shape. This means that the vibrating part 22 is quadruply sealed by the inner and outer peripheral edge parts. Therefore, in this Variation, it is possible to increase the annular bonding regions in the dense state, which further improves the hermeticity of the bonding materials 15a and 15b.

Here, by forming the bonding materials 15a and 15b in the pressurized state, it is possible to form the inner peripheral edge parts 154a and 154b, and 157a and 157b and the outer peripheral edge parts 155a and 155b, and 158a and 158b of the bonding materials 15a and 15b in a further dense state, i.e. in the state including a smaller number of voids than the case in which the bonding materials 15a and 15b are not pressurized to be formed. Thus, the hermeticity of the bonding materials 15a and 15b can be further improved. Also, in this Variation, the gap between the crystal resonator plate 2a and the first sealing member 3a (1.00 μm or less) and the gap between the crystal resonator plate 2a and the second sealing member 4a (1.00 μm or less) are set to 0.1 times or less the thickness of the first sealing member 3a and the second sealing member 4a (30 to 80 μm). In this way, when the bonding materials 15a and 15b are bonded in the pressurized state, it is possible to form the inner peripheral edge parts 154a and 154b, and 157a and 157b as well as the outer peripheral edge parts 155a and 155b, and 158a and 158b of the bonding materials 15a and 15b in a further dense state, which further improves the hermeticity of the bonding materials 15a and 15b.

Next, in the crystal resonator 10b according to Variation 2 illustrated in FIG. 16, the sealing-member-side first bonding pattern (second metal film) formed on the second main surface 312 of the first sealing member 3b has the same configuration as that in Variation 1 (see FIG. 10). That is, the sealing-member-side first bonding pattern is formed so as to be divided, by an annular slit 322, into the sealing-member-side first inner bonding pattern (inner peripheral side metal film) and the sealing-member-side first outer bonding pattern (outer peripheral side metal film), which constitute double annular patterns. Also, the sealing-member-side second bonding pattern (second metal film) formed on the first main surface 411 of a second sealing member 4b has the same configuration as that in Variation 1 (see FIG. 13). That is, the sealing-member-side second bonding pattern is formed so as to be divided, by an annular slit 422, into the sealing-member-side second inner bonding pattern (inner peripheral side metal film) and the sealing-member-side second outer bonding pattern (outer peripheral side metal film), which constitute double annular patterns.

On the other hand, a resonator-plate-side first bonding pattern (first metal film) 251b formed on the first main surface 211 of a crystal resonator plate 2b and a resonator-plate-side second bonding pattern (first metal film) 252b formed on the second main surface 212 of the crystal resonator plate 2b each have the same configuration as those in the above embodiment (see FIGS. 4 and 5). That is, they do not have an annular slit, thus, none of them has the double annular patterns.

In the crystal resonator 10b according to Variation 2 also, an annular bonding material 16a is interposed between the crystal resonator plate 2b and the first sealing member 3b, and an annular bonding material 16b is interposed between the crystal resonator plate 2b and the second sealing member 4b, as shown in FIG. 16. The bonding materials 16a and 16b respectively have inner peripheral side bonding materials 161a and 161b, and outer peripheral side bonding materials 162a and 162b. The inner peripheral side bonding material 161a is connected to the outer peripheral side bonding material 162a, and the inner peripheral side bonding material 161b is connected to the outer peripheral side bonding material 162b, respectively through the resonator-plate-side first bonding pattern 251b and the resonator-plate-side second bonding pattern 252b that are not used for (do not contribute to) bonding. Similarly to Variation 1, the inner peripheral side bonding materials 161a and 161b each include: the annular inner peripheral edge part positioned innermost; the annular outer peripheral edge part positioned outermost; and the annular intermediate part positioned between the inner peripheral edge part and the outer peripheral edge part. Also similarly to Variation 1, the outer peripheral side bonding materials 162a and 162b each include: the annular inner peripheral edge part positioned innermost; the annular outer peripheral edge part positioned outermost; and the annular intermediate part positioned between the inner peripheral edge part and the outer peripheral edge part.

The crystal resonator 10b according to Variation 2 can also obtain an effect similar to that of the crystal resonator 10a according to above-described Variation 1. That is, it is possible to improve the hermeticity of the bonding materials 16a and 16b that seal the vibrating part 22 causing piezoelectric resonance by disposing a plurality of (in this example, four) dense bonding regions (i.e. inner peripheral edge parts and outer peripheral edge parts) in the bonding materials 16a and 16b (the inner peripheral side bonding materials 161a and 161b, and the outer peripheral side bonding materials 162a and 162b). Therefore, in this Variation, it is possible to increase the annular bonding regions in the dense state, which further improves the hermeticity of the bonding materials 16a and 16b.

In the first sealing member 3b, the width of the sealing-member-side first inner bonding pattern may differ from the width of the sealing-member-side first outer bonding pattern. For example, the width of the sealing-member-side first inner bonding pattern may be larger than the width of the sealing-member-side first outer bonding pattern. Similarly to the above, in the second sealing member 4b, the width of the sealing-member-side second inner bonding pattern may differ from the width of the sealing-member-side second outer bonding pattern. For example, the width of the sealing-member-side second inner bonding pattern may be larger than the width of the sealing-member-side second outer bonding pattern. Also, the sealing-member-side first bonding pattern of the first sealing member 3b and the sealing-member-side second bonding pattern of the second sealing member 4b may each be formed as a single annular pattern not including any annular slit while forming each of the resonator-plate-side first bonding pattern and the resonator-plate-side second bonding pattern of the crystal resonator plate 2b as double annular patterns including an annular slit. The crystal resonator plate 2b is required to ensure the region on which are provided the first and second excitation electrodes 221 and 222, and furthermore the first and second extraction electrodes 223 and 224. Thus, taking into account the easiness in pattern formation or the downsizing of the package 12, it is preferable to form each of the resonator-plate-side first bonding pattern and the resonator-plate-side second bonding pattern of the crystal resonator plate 2b as a single annular pattern not including any annular slit and furthermore to form each of the sealing-member-side first bonding pattern of the first sealing member 3b and the sealing-member-side second bonding pattern of the second sealing member 4b as double annular patterns including an annular slit.

Next, in the crystal resonator 10c according to Variation 3 illustrated in FIG. 17, a sealing-member-side first bonding pattern (second metal film) 321c formed on the second main surface 312 of a first sealing member 3c has the same configuration as that in Variation 1 (see FIG. 10). That is, the sealing-member-side first bonding pattern 321c is formed so as to be divided, by an annular slit 323, into the sealing-member-side first inner bonding pattern (inner peripheral side metal film) and the sealing-member-side first outer bonding pattern (outer peripheral side metal film), which constitute double annular patterns. Also, a sealing-member-side second bonding pattern (second metal film) 421c formed on the first main surface 411 of a second sealing member 4c has the same configuration as that in Variation 1 (see FIG. 13). That is, the sealing-member-side second bonding pattern 421c is formed so as to be divided, by an annular slit 423, into the sealing-member-side second inner bonding pattern (inner peripheral side metal film) and the sealing-member-side second outer bonding pattern (outer peripheral side metal film), which constitute double annular patterns.

On the other hand, a resonator-plate-side first bonding pattern (first metal film) 251c formed on the first main surface 211 of a crystal resonator plate 2c is formed so as to be divided, by two annular slits 253a and 254a, into the sealing-member-side first inner bonding pattern (inner peripheral side metal film), a sealing-member-side first intermediate bonding pattern (intermediate metal film) and the sealing-member-side first outer bonding pattern (outer peripheral side metal film), which constitute triple annular patterns. A resonator-plate-side second bonding pattern (first metal film) 252c formed on the second main surface 212 of the crystal resonator plate 2c is formed so as to be divided, by two annular slits 253b and 254b, into the sealing-member-side second inner bonding pattern (inner peripheral side metal film), a sealing-member-side second intermediate bonding pattern (intermediate metal film) and the sealing-member-side second outer bonding pattern (outer peripheral side metal film), which constitute triple annular patterns.

In the crystal resonator 10c according to Variation 3 also, an annular bonding material 17a is interposed between the crystal resonator plate 2c and the first sealing member 3c, and an annular bonding material 17b is interposed between the crystal resonator plate 2c and the second sealing member 4c, as shown in FIG. 17. The bonding materials 17a and 17b respectively have: inner peripheral side bonding materials 171a and 171b; outer peripheral side bonding materials 172a and 172b; and intermediate part bonding materials 173a and 173b, and 174a and 174b. The inner peripheral side bonding material 171a, the outer peripheral side bonding material 172a, and the intermediate part bonding materials 173a and 174a are connected to one another through the resonator-plate-side first bonding pattern 251c and the sealing-member-side first bonding pattern 321c that are not used for (do not contribute to) bonding. The inner peripheral side bonding material 171b, the outer peripheral side bonding material 172b, and the intermediate part bonding materials 173b and 174b are connected to one another through the resonator-plate-side second bonding pattern 252c and the sealing-member-side second bonding pattern 421c that are not used for (do not contribute to) bonding.

Similarly to Variation 1, the inner peripheral side bonding materials 171a and 171b each include: the annular inner peripheral edge part positioned innermost; the annular outer peripheral edge part positioned outermost; and the annular intermediate part positioned between the inner peripheral edge part and the outer peripheral edge part. Also similarly to Variation 1, the outer peripheral side bonding materials 172a and 172b each include: the annular inner peripheral edge part positioned innermost; the annular outer peripheral edge part positioned outermost; and the annular intermediate part positioned between the inner peripheral edge part and the outer peripheral edge part. Furthermore, the intermediate part bonding materials 173a and 173b, and 174a and 174b each include: the annular inner peripheral edge part positioned innermost; the annular outer peripheral edge part positioned outermost; and the annular intermediate part positioned between the inner peripheral edge part and the outer peripheral edge part.

The crystal resonator 10c according to Variation 3 can also obtain an effect similar to those of the crystal resonators 10a and 10b according to above-described Variations 1 and 2. That is, it is possible to improve the hermeticity of the bonding materials 17a and 17b that seal the vibrating part 22 causing piezoelectric resonance by disposing a plurality of (in this example, eight) dense bonding regions (i.e. inner peripheral edge parts and outer peripheral edge parts) in the bonding materials 17a and 17b (the inner peripheral side bonding materials 171a and 171b, the outer peripheral side bonding materials 172a and 172b, and the intermediate part bonding materials 173a and 173b, and 174a and 174b). Therefore, in this Variation, it is possible to increase the annular bonding regions in the dense state, which further improves the hermeticity of the bonding materials 17a and 17b.

—Method for Manufacturing Crystal Resonator—

Next, a method for manufacturing the piezoelectric resonator device according to this embodiment will be described with reference to FIGS. 18 to 20. Here, a method for manufacturing the above-described crystal resonator 10 (see FIGS. 1 to 8) will be described as one example for manufacturing the piezoelectric resonator device.

Figure 18:
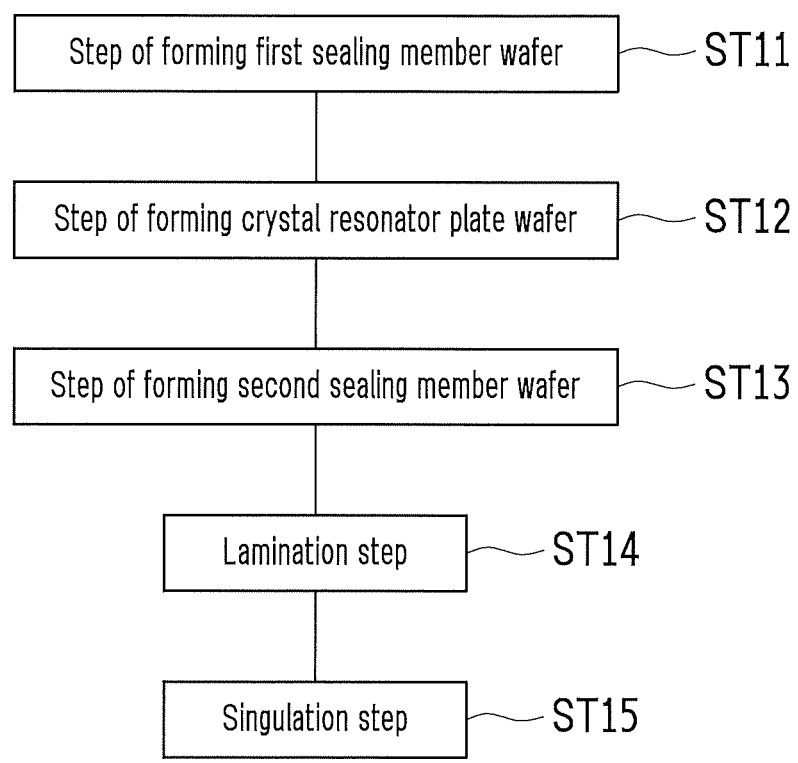
FIG. 18 is a flowchart indicating an example of a method for manufacturing the crystal resonator according to the embodiment.
Figure 19:
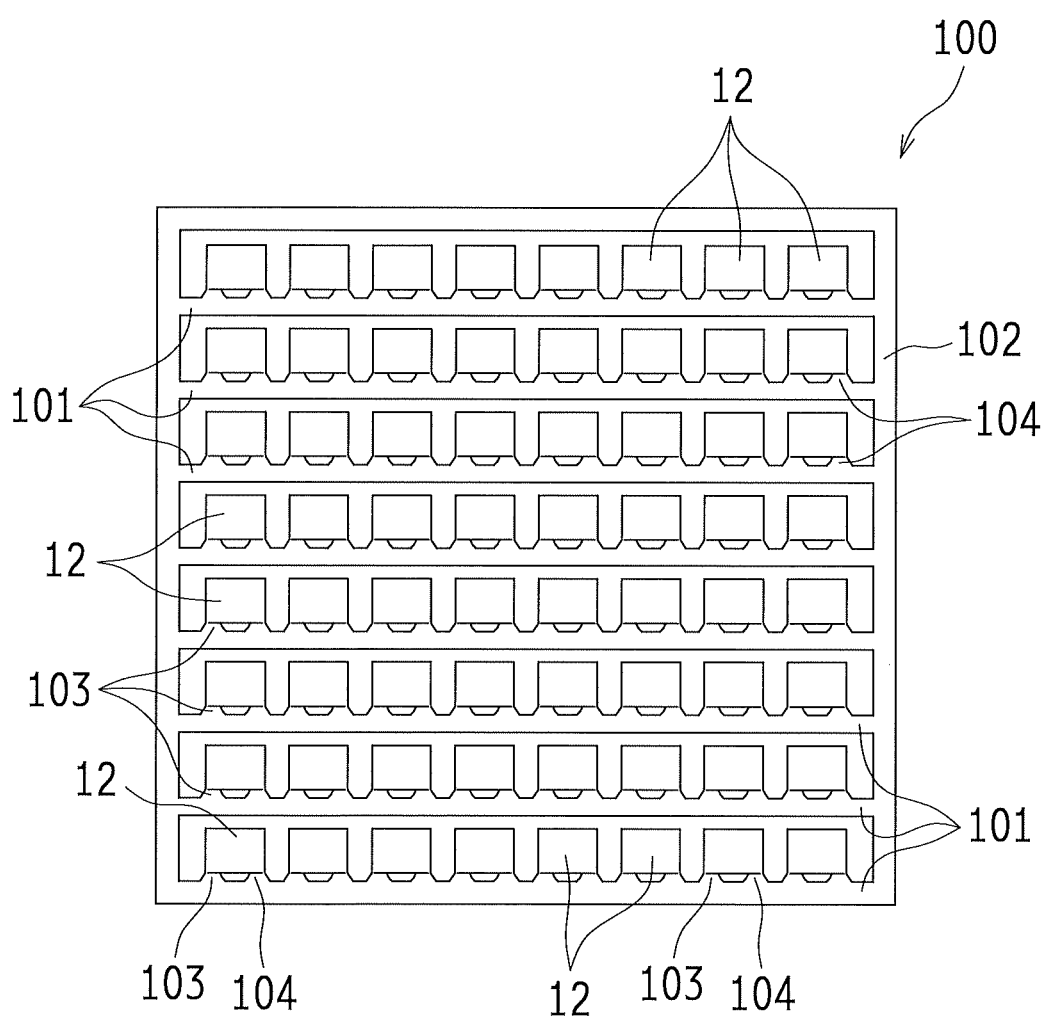
FIG. 19 is a schematic plan view illustrating an example of a crystal wafer formed in a lamination step in the method for manufacturing the crystal resonator of FIG. 18.
Figure 19:
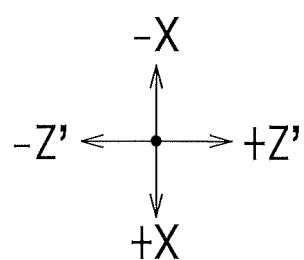

As shown in FIG. 18, the method for manufacturing the crystal resonator 10 according to this embodiment includes: a step of forming a first sealing member wafer (ST 11); a step of forming a crystal resonator plate wafer (ST 12); a step of forming a second sealing member wafer (ST 13); a lamination step of forming a crystal wafer (wafer laminate) 100 (ST 14) shown in FIG. 19 by laminating the first sealing member wafer formed in step ST 11, the crystal resonator plate wafer formed in step ST 12 and the second sealing member wafer formed in step ST 13; and a singulation step of singulating the crystal wafer 100 into the packages 12 of the crystal resonators 10 (ST 15). The order of the steps of forming the first sealing member wafer, the crystal resonator plate wafer and the second sealing member wafer is not particularly limited. The respective steps of forming the first sealing member wafer, the crystal resonator plate wafer and the second sealing member wafer may be simultaneously performed.

Here, the crystal wafer 1 is described with reference to FIGS. 19 and 20. As shown in FIG. 20, the crystal wafer 100 is a laminate made by laminating a first sealing member wafer 100B, a crystal resonator plate wafer 100A and a second sealing member wafer 100C.

As shown in FIG. 19, the crystal wafer 100 contains multiple packages 12 of the crystal resonators 10. In the example as shown in FIG. 19, the multiple packages 12, each of which is formed so as to have a substantially rectangular shape in plan view, are arranged in a matrix form in the crystal wafer 100. Specifically, 8 packages 12 are respectively arranged in the vertical direction (the X axis direction in FIG. 19) and in the horizontal direction (the Z' axis direction in FIG. 19), accordingly, 64 packages 12 are provided in total. Note that the number of the packages 12 is exemplarily indicated here, and is not limited thereto.

The crystal wafer 100 is provided with multiple support parts (crosspiece parts) 101 to support the multiple packages 12. Each of the support parts 101 extends in the Z' axis direction of the crystal wafer 100. Both end parts of the support part 101 are integrally connected to a frame part (external frame part) 102 of the crystal wafer 100. The multiple support parts 101 (8 support parts 101 in FIG. 19) are disposed at predetermined intervals in the X axis direction of the crystal wafer 100. The frame part 102 is a substantially rectangular-shaped frame body in plan view with one side thereof being opened, that is, the frame part 102 has a substantially squared-U shape. One of the support parts 101 is disposed at a position corresponding to the opened side of the frame part 102. Thus, the annular frame body is integrally formed by this support part 101 and the frame part 102.

The support part 101 supports multiple packages 12 (8 packages 12 in FIG. 19). The packages 12 are arranged at predetermined intervals in the Z' axis direction of the crystal wafer 100. The support part 101 is disposed on one side of the packages 12 (in the +X direction in FIG. 19) in plan view. Each of the packages 12 is connected to the support part 101 via two connecting parts (break-off parts) 103 and 104.

Figure 20:
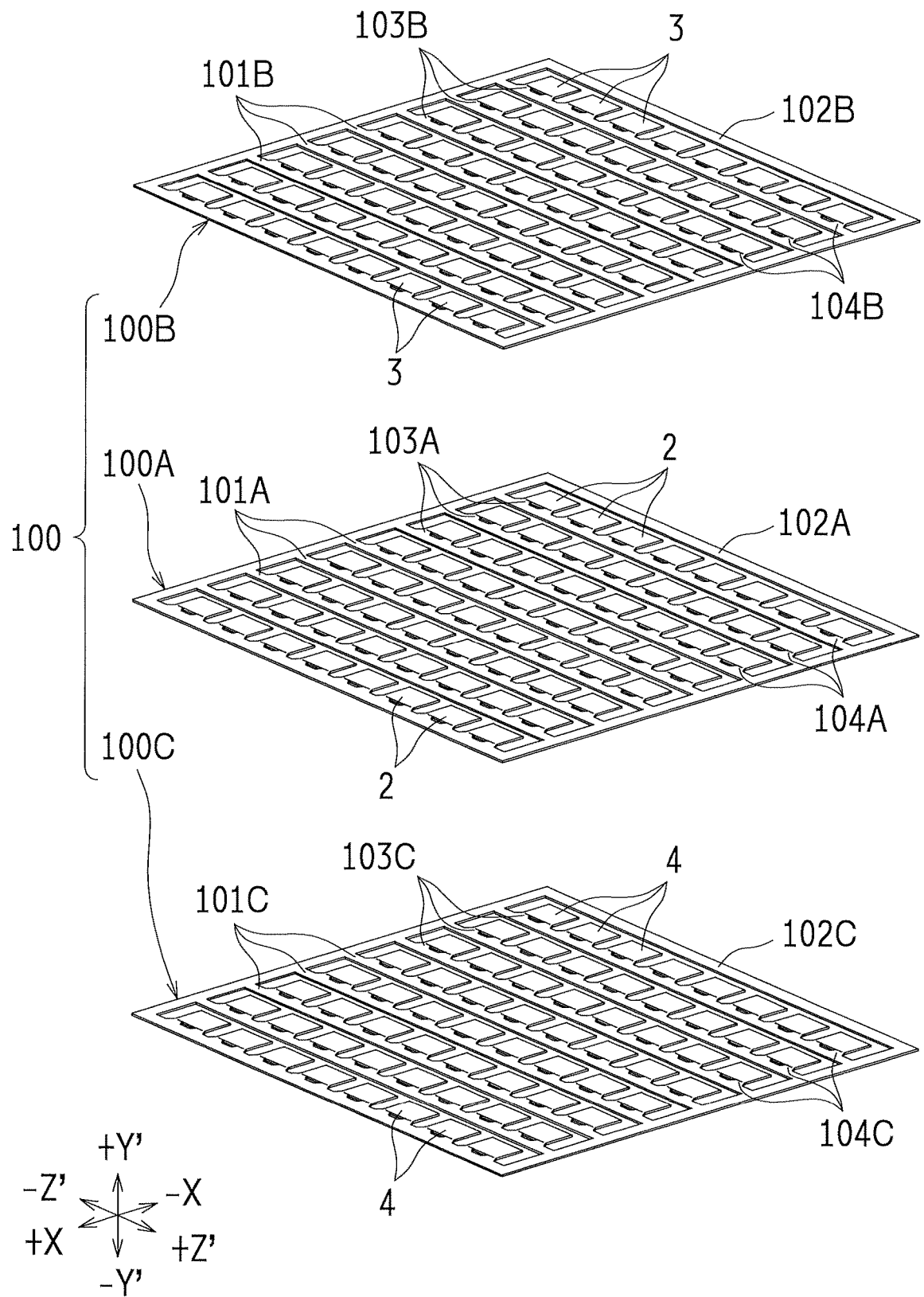
FIG. 20 is an exploded perspective view illustrating a wafer for the first sealing member, a wafer for the crystal resonator plate, and a wafer for the second sealing member, which constitute the crystal wafer of FIG. 19.

As described above, the crystal wafer 100 is a laminate made by laminating the first sealing member wafer 100B, the crystal resonator plate wafer 100A and the second sealing member wafer 100C (see FIG. 20). The crystal resonator plate wafer 100A, the first sealing member wafer 100B and the second sealing member wafer 100C each have a shape similar to the above-described crystal wafer 100 in plan view (see FIG. 19).

As shown in FIG. 20, the crystal resonator plate wafer 100A contains a plurality of the above-described crystal resonator plates 2 (see FIGS. 4 and 5). In the example as shown in FIG. 20, the multiple crystal resonator plates 2 are arranged in a matrix form in the crystal resonator plate wafer 100A. Specifically, 8 crystal resonator plates 2 are respectively arranged in the vertical direction (the X axis direction in FIG. 20) and in the horizontal direction (the Z' axis direction in FIG. 20), accordingly, 64 crystal resonator plates 2 are provided in total. In the crystal resonator plate wafer 100A, similarly to the above-described crystal wafer 100, each of the crystal resonator plates 2 is supported by a support part 101A via a first connecting part 103A and a second connecting part 104A. Both end parts of the support part 101A are integrally connected to a frame part 102A.

As shown in FIG. 20, the first sealing member wafer 100B contains a plurality of the above-described first sealing members 3 (see FIGS. 2 and 3). In the example as shown in FIG. 20, the multiple first sealing members 3 are arranged in a matrix form in the first sealing member wafer 100B. Specifically, 8 first sealing members 3 are respectively arranged in the vertical direction (the X axis direction in FIG. 20) and in the horizontal direction (the Z' axis direction in FIG. 20), accordingly, 64 first sealing members 3 are provided in total. In the first sealing member wafer 100B, similarly to the above-described crystal wafer 100, each of the first sealing members 3 is supported by a support part 101B via a first connecting part 103B and a second connecting part 104B. Both end parts of the support part 101B are integrally connected to a frame part 102B.

As shown in FIG. 20, the second sealing member wafer 100C contains a plurality of the above-described second sealing members 4 (see FIGS. 6 and 7). In the example as shown in FIG. 20, the multiple second sealing members 4 are arranged in a matrix form in the second sealing member wafer 100C. Specifically, 8 second sealing members 4 are respectively arranged in the vertical direction (the X axis direction in FIG. 20) and in the horizontal direction (the Z' axis direction in FIG. 20), accordingly, 64 second sealing members 4 are provided in total. In the second sealing member wafer 100C, similarly to the above-described crystal wafer 100, each of the second sealing members 4 is supported by a support part 101C via a first connecting part 103C and a second connecting part 104C.

The first sealing member wafer 100B and the second sealing member wafer 100C are laminated and bonded, with the crystal resonator plate wafer 100A being interposed theirbetween. Thus, the crystal wafer 100 is formed, which contains the multiple packages 12 of the crystal resonators 10 having the sandwich structure, as shown in FIG. 19. In this case, each first connecting part 103 and each second connecting part 104 of the crystal wafer 100 are configured, respectively, by: lamination of the first connecting part 103B of the first sealing member wafer 100B, the first connecting part 103A of the crystal resonator plate wafer 100A, and the first connecting part 103C of the second sealing member wafer 100C; and lamination of the second connecting part 104B of the first sealing member wafer 100B, the second connecting part 104A of the crystal resonator plate wafer 100A, and the second connecting part 104C of the second sealing member wafer 100C. Each first connecting part 103B of the first sealing member wafer 100B is located at substantially the same position, in plan view, as the corresponding first connecting part 103A of the crystal resonator plate wafer 100A and the corresponding first connecting part 103C of the second sealing member wafer 100C. Each second connecting part 104B of the first sealing member wafer 100B is located at substantially the same position, in plan view, as the corresponding second connecting part 104A of the crystal resonator plate wafer 100A and the corresponding second connecting part 104C of the second sealing member wafer 100C.

Next, each step in the method for manufacturing the crystal resonator 10, which is indicated in FIG. 18, is described.

The step of forming the first sealing member wafer (ST 11) is a step in which is formed the first sealing member wafer 100B as shown in FIG. 20. As described above, the first sealing member wafer 100B contains a plurality of the first sealing members 3 each having a substantially rectangular shape in plan view. Specifically, each of the first sealing members 3 is connected, via the first connecting part 103B and the second connecting part 104B, to the support part 101B that is disposed along one side of the first sealing member 3 in plan view so as to be spaced apart from the first sealing member 3.

In the step of forming the first sealing member wafer, a crystal blank (an AT-cut crystal plate) is subjected to, for example, wet etching so that the respective first sealing members 3, the support parts 101B, the frame part 102B, and the first and second connecting parts 103B and 104B of the first sealing member wafer 100B are formed. Also, on each of the first sealing members 3, the base PVD film and the electrode PVD film are formed using a PVD method such as sputtering so that the sealing-member-side first bonding pattern 321, the connecting bonding patterns 35 and 36 and the wiring pattern 33 are formed. Here, the sealing-member-side first bonding pattern 321, the connecting bonding patterns 35 and 36 and the wiring pattern 33 on the second main surface 312 of each of the first sealing members 3 can have the same configuration. In this case, it is possible to form collectively the sealing-member-side first bonding pattern 321, the connecting bonding patterns 35 and 36 and the wiring pattern 33 in the same process.

The step of forming the crystal resonator plate wafer (ST 12) is a step in which is formed the crystal resonator plate wafer 100A as shown in FIG. 20. As described above, the crystal resonator plate wafer 100A contains a plurality of the crystal resonator plates 2 each having a substantially rectangular shape in plan view. Specifically, each of the crystal resonator plates 2 is connected, via the first connecting part 103A and the second connecting part 104A, to the support part 101A that is disposed along one side of the crystal resonator plate 2 in plan view so as to be spaced apart from the crystal resonator plate 2.

In the step of forming the crystal resonator plate wafer, a crystal blank (an AT-cut crystal plate) is subjected to, for example, wet etching so that the respective crystal resonator plates 2, the support parts 101A, the frame part 102A and the first and second connecting parts 103A and 104A of the crystal resonator plate wafer 100A are formed. Each of the crystal resonator plates 2 is subjected to, for example, wet etching so that the first through hole 26 and the space 22b between the vibrating part 22 and the external frame part 23 are formed.

Also, on each of the crystal resonator plate 2, the base PVD film and the electrode PVD film are formed using a PVD method such as sputtering so that the first excitation electrode 221, the second excitation electrode 222, the first extraction electrode 223, the second extraction electrode 224, the resonator-plate-side first bonding pattern 251, the resonator-plate-side second bonding pattern 252 and the connecting bonding patterns 27, 28, 264 and 265 are formed. Here, the first excitation electrode 221, the first extraction electrode 223, the resonator-plate-side first bonding pattern 251 and the connecting bonding patterns 27 and 264 on the first main surface 211 of each of the crystal resonator plates 2 can have the same configuration. In this case, it is possible to form collectively the first excitation electrode 221, the first extraction electrode 223, the resonator-plate-side first bonding pattern 251 and the connecting bonding patterns 27 and 264 in the same process. Similarly to the above, the second excitation electrode 222, the second extraction electrode 224, the resonator-plate-side second bonding pattern 252 and the connecting bonding patterns 28 and 265 on the second main surface 212 of each of the crystal resonator plates 2 can have the same configuration. In this case, it is possible to form collectively the second excitation electrode 222, the second extraction electrode 224, the resonator-plate-side second bonding pattern 252 and the connecting bonding patterns 28 and 265 in the same process. It is also possible to form collectively all of the following of the crystal resonator plate 2: the first excitation electrode 221, the first extraction electrode 223 and the bonding patterns 251, 27 and 264 on the first main surface 211; and the second excitation electrode 222, the second extraction electrode 224 and the bonding patterns 252, 28 and 265 on the second main surface 212.

The step of forming the second sealing member wafer (ST 13) is a step in which is formed the second sealing member wafer 100C as shown in FIG. 20. As described above, the second sealing member wafer 100C contains a plurality of the second sealing members 4 each having a substantially rectangular shape in plan view. Specifically, each of the second sealing members 4 is connected, via the first connecting part 103C and the second connecting part 104C, to the support part 101C that is disposed along one side of the second sealing member 4 in plan view so as to be spaced apart from the second sealing member 4.

In the step of forming the second sealing member wafer, a crystal blank (an AT-cut crystal plate) is subjected to, for example, wet etching so that the respective second sealing members 4, the support parts 101C, a frame part 102C and the first and second connecting parts 103C and 104C of the second sealing member wafer 100C are formed. Each of the second sealing members 4 is subjected to, for example, wet etching so that the second through hole 45 and the third through hole 46 are formed.

Also, on each of the second sealing members 4, the base PVD film and the electrode PVD film are formed using a PVD method such as sputtering so that the sealing-member-side second bonding pattern 421, the first external electrode terminal 431, the second external electrode terminal 432 and the connecting bonding patterns 453 and 463 are formed. Here, the sealing-member-side second bonding pattern 421 and the connecting bonding patterns 453 and 463 on the first main surface 411 of each of the second sealing members 4 can have the same configuration. In this case, it is possible to form collectively the sealing-member-side second bonding pattern 421 and the connecting bonding patterns 453 and 463 in the same process.

The lamination step (ST 14) is a step of laminating: the first sealing member wafer 100B formed in the step of forming the first sealing member wafer (ST 11); the crystal resonator plate wafer 100A formed in the step of forming the crystal resonator plate wafer (ST 12); and the second sealing member wafer 100C formed in the step of forming the second sealing member wafer (ST 13), so that the crystal wafer 100 is formed. That is, in the lamination step, the respective first sealing members 3 of the first sealing member wafer 100B, the respective crystal resonator plates 2 of the crystal resonator plate wafer 100A and the respective second sealing members 4 of the second sealing member wafer 100C are laminated.

More specifically, the respective resonator-plate-side first bonding patterns 251 of the crystal resonator plates 2 of the crystal resonator plate wafer 100A and the respective sealing-member-side first bonding patterns 321 of the first sealing members 3 of the first sealing member wafer 100B are superimposed on each other and subjected to the diffusion bonding. The respective resonator-plate-side second bonding patterns 252 of the crystal resonator plates 2 of the crystal resonator plate wafer 100A and the respective sealing-member-side second bonding patterns 421 of the second sealing members 4 of the second sealing member wafer 100C are superimposed on each other and subjected to the diffusion bonding. Thus, the respective bonding materials 11a and 11b as the sealing parts are formed (see FIG. 8). Then, each of the crystal resonator plates 2 is bonded to the corresponding first sealing member 3 by the bonding material 11a while each of the crystal resonator plates 2 is bonded to the corresponding second sealing member 4 by the bonding material 11b. That is, the annular bonding material 11a is interposed between the crystal resonator plate 2 and the first sealing member 3 while the annular bonding material 11b is interposed between the crystal resonator plate 2 and the second sealing member 4. A gap between the crystal resonator plate 2 and the first sealing member 3 is not more than 1.00 µm. A gap between the crystal resonator plate 2 and the second sealing member 4 is not more than 1.00 µm.

Also, the respective connecting bonding patterns 264 of the crystal resonator plates 2 of the crystal resonator plate wafer 100A and the respective connecting bonding patterns 35 of the first sealing members 3 of the first sealing member wafer 100B are subjected to the diffusion bonding. The respective connecting bonding patterns 27 of the crystal resonator plates 2 of the crystal resonator plate wafer 100A and the respective connecting bonding patterns 36 of the first sealing members 3 of the first sealing member wafer 100B are subjected to the diffusion bonding. The respective connecting bonding patterns 265 of the crystal resonator plates 2 of the crystal resonator plate wafer 100A and the respective connecting bonding patterns 453 of the second sealing members 4 of the second sealing member wafer 100C are subjected to the diffusion bonding. The respective connecting bonding patterns 28 of the crystal resonator plates 2 of the crystal resonator plate wafer 100A and the respective connecting bonding patterns 463 of the second sealing members 4 of the second sealing member wafer 100C are subjected to the diffusion bonding.

In the lamination step, the respective crystal resonator plates 2 of the crystal resonator plate wafer 100A may be bonded to the respective second sealing members 4 of the second sealing member wafer 100C after the respective first sealing members 3 of the first sealing member wafer 100B are bonded to the respective crystal resonator plates 2 of the crystal resonator plate wafer 100A. Alternatively, the respective first sealing members 3 of the first sealing member wafer 100B may be bonded to the respective crystal resonator plates 2 of the crystal resonator plate wafer 100A after the respective crystal resonator plates 2 of the crystal resonator plate wafer 100A are bonded to the respective second sealing members 4 of the second sealing member wafer 100C.

By the above-described lamination step, the crystal wafer 100 is formed, which contains the multiple substantially rectangular parallelepiped-shaped packages 12 of the crystal resonators 10. In each of the packages 12, the gap between the first sealing member 3 and the crystal resonator plate 2 is not more than 1.00 µm. The gap between the second sealing member 4 and the crystal resonator plate 2 is not more than 1.00 µm. That is, the thickness of the bonding material 11 between the first sealing member 3 and the crystal resonator plate 2 is not more than 1.00 µm, and the thickness of the bonding material 11 between the second sealing member 4 and the crystal resonator plate 2 is not more than 1.00 µm (specifically, the thickness in the Au—Au bonding of this embodiment is 0.15 to 1.00 µm). As a comparative example, the conventional metal paste sealing material containing Sn has a thickness of 5 to 20 µm.

In the crystal wafer 100 after the lamination step, each of the first connecting parts 103B of the first sealing members 3 of the first sealing member wafer 100B is located at substantially the same position, in plan view, as the corresponding first connecting part 103A of the crystal resonator plate 2 of the crystal resonator plate wafer 100A and as the corresponding first connecting part 103C of the second sealing member 4 of the second sealing member wafer 100C. Each of the second connecting parts 104B of the first sealing members 3 of the first sealing member wafer 100B is located at substantially the same position, in plan view, as the corresponding second connecting part 14A of the crystal resonator plate 2 of the crystal resonator plate wafer 100A and as the corresponding second connecting part 104C of the second sealing member 4 of the second sealing member wafer 100C.

In the singulation step (ST 15), the first sealing member 3 of each of the packages 12 of the crystal wafer 100 is pressed with, for example, a bar-like pressing member so that the package 12 is broken off (singulated) from the crystal wafer 100. Thus, each of the packages 12 is singulated. In this case, it is preferable to press an opposite side to the side on which the first and second connecting parts 103 and 104 of the package 12 (first sealing member 3) are disposed.

In this embodiment, in the step of forming the first sealing member wafer (ST 11), the electrode PVD film of each of the sealing-member-side first bonding pattern 321 and the connecting bonding patterns 35 and 36 formed on the first sealing member 3 is a metal film made of Au (i.e. Au layer), and each bonding pattern is formed by sputtering. In the step of forming the crystal resonator plate wafer (ST 12), the electrode PVD film of each of the resonator-plate-side first bonding pattern 251, the resonator-plate-side second bonding pattern 252 and the connecting bonding patterns 27, 28, 264 and 265 formed on the crystal resonator plate 2 is a metal film made of Au (i.e. Au layer), and each bonding pattern is formed by sputtering. In the step of forming the second sealing member wafer (ST 13), the electrode PVD film of each of the sealing-member-side second bonding pattern 421 and the connecting bonding patterns 453 and 463 formed on the second sealing member 4 is a metal film made of Au (i.e. Au layer), and each bonding pattern is formed by sputtering.

Then, in the lamination step (ST 14), the respective bonding patterns are bonded (in this case, Au—Au bonding), in other words, the bonding materials 11a and 11b (sealing bonding materials) as the sealing parts are formed in the pressurized state. That is, the bonding materials 11a and 11b are formed by the diffusion bonding in the pressurized state (i.e. by the pressure diffusion bonding).

In this embodiment, the respective bonding patterns can be easily formed by sputtering in the step of forming the first sealing member wafer (ST 11), in the step of forming the crystal resonator plate wafer (ST 12) and in the step of forming the second sealing member wafer (ST 13). Furthermore, in the lamination step (ST 14), the bonding materials 11a and 11b are formed by the pressure diffusion bonding (Au—Au bonding). Thus, it is possible to increase the bonding strength of the bonding materials 11a and 11b.

In addition to the above, it is possible to obtain an effect similar to that of the above-described crystal resonator 10. That is, when the bonding materials 11a and 11b are formed as shown in FIGS. 8 and 9, the inner peripheral edge parts 111a and 111b, and the outer peripheral edge parts 112a and 112b of the respective bonding materials 11a and 11b are formed denser than intermediate parts 113a and 113b formed respectively between the inner peripheral edge part 111a and the outer peripheral edge part 112a and between the inner peripheral edge part 111b and the outer peripheral edge part 112b. Thus, it is possible to improve the hermeticity of the bonding materials 11a and 11b that seal the vibrating part 22 causing piezoelectric resonance. Here, when the bonding materials are formed "in the dense state", it means that the bonding materials are formed so as to include a relatively small number of voids generated inside the bonding material. Conversely, when the bonding materials are formed "in the sparse state", it means that the bonding materials are formed so as to include a relatively large number of voids generated inside the bonding material.

Specifically, as shown in FIGS. 8 and 9, the bonding materials 11a and 11b respectively include, in plan view: the annular inner peripheral edge parts 111a and 111b positioned innermost; the annular outer peripheral edge parts 112a and 112b positioned outermost; and the annular intermediate parts 113a and 113b positioned respectively between the inner peripheral edge part 111a and the outer peripheral edge part 112a and between the inner peripheral edge part 111b and the outer peripheral edge part 112b. The intermediate parts 113a and 113b are provided adjacent respectively to the outer peripheral sides of the inner peripheral edge parts 111a and 111b, and the outer peripheral edge parts 112a and 112b are provided adjacent respectively to the outer peripheral sides of the intermediate parts 113a and 113b. The respective widths W 10 and W 20 of the bonding materials 11a and 11b are in the range from 30 to 60 μm. The respective widths W 11 and W 21 of the inner peripheral edge parts 111a and 111b, and also the respective widths W 12 and W 22 of the outer peripheral edge parts 112a and 112b are in the range from 3 to 5 μm. The respective widths W 13 and W 23 of the intermediate parts 113a and 113b are in the range from 20 to 54 μm.

The inner peripheral edge parts 111a and 111b as well as the outer peripheral edge parts 112a and 112b of the bonding materials 11a and 11b are formed denser than the intermediate parts 113a and 113b, that is, they are formed so as to include a relatively small number of voids generated inside the bonding material. Conversely, the intermediate parts 113a and 113b are formed sparser than the inner peripheral edge parts 111a and 111b and the outer peripheral edge parts 112a and 112b, that is, they are formed so as to include a relatively large number of voids generated inside the bonding material. The above dense state and sparse state of the bonding materials 11a and 11b are likely to be generated for the reasons as described below.

During the pressurization as described above, the first sealing member wafer 100B (first sealing member 3) is compressed. Thus, large stress is applied to the inner peripheral edge part and the outer peripheral edge part of each bonding pattern compared to stress applied to the intermediate part between the inner peripheral edge part and the outer peripheral edge part. More specifically, in the first sealing member wafer 100B (first sealing member 3), the compression amount by the pressurization of the regions where the bonding patterns are disposed (where the bonding patterns exist) is larger than the compression amount of the regions where no bonding pattern is disposed (where there is no bonding pattern). Due to such a difference in the compression amount, in the first sealing member wafer 100B (first sealing member 3), the regions where no bonding pattern is disposed deform so as to incline obliquely relative to the regions where the bonding patterns are disposed. The above inclination on the first sealing member wafer 100B (first sealing member 3) causes large stress applied to the inner peripheral edge part and the outer peripheral edge part of each bonding pattern compared to stress applied to the intermediate part between the inner peripheral edge part and the outer peripheral edge part. Similarly to the above, in the second sealing member wafer 100C (second sealing member 4), large stress is applied to the inner peripheral edge part and the outer peripheral edge part of each bonding pattern compared to stress applied to the intermediate part between the inner peripheral edge part and the outer peripheral edge part.

In this way, when the bonding materials 11a and 11b are formed, the inner peripheral edge parts 111a and 111b as well as the outer peripheral edge parts 112a and 112b of the bonding materials 11a and 11b, to which is applied relatively large stress, are formed in the dense state compared to the intermediate parts 113a and 113b. On the other hand, the intermediate parts 113a and 113b of the bonding materials 11a and 11b, to which is applied relatively small stress, are formed in the sparse state compared to the inner peripheral edge parts 111a and 111b, and the outer peripheral edge parts 112a and 112b.

Thus, the bonding materials 11a and 11b respectively have a plurality of (in this example, two) bonding regions in the dense state, specifically, the inner peripheral edge parts 111a and 111b, and the outer peripheral edge parts 112a and 112b. Therefore, it is possible to improve the hermeticity of the bonding materials 11a and 11b that seal the vibrating part 22 causing piezoelectric resonance.

To be specific, the inner peripheral edge parts 111a and 111b and the outer peripheral edge parts 112a and 112b, which are the dense bonding regions including a relatively small number of voids, are formed to each have an annular shape. This means that the vibrating part 22 is doubly sealed by the inner and outer peripheral edge parts. Therefore, in this embodiment, it is possible to improve the hermeticity of the bonding materials 11a and 11b compared to the cases in which: no dense bonding region is provided; the dense bonding region is not formed to have an annular shape; or only one annular and dense bonding region is formed. Especially, in the bonding materials 11a and 11b of this embodiment, the inner peripheral edge parts 111a and 111b and the outer peripheral edge parts 112a and 112b, which are the regions that make direct contact, respectively, with the inner and outer spaces of the package 12 (specifically, the internal space 13 of the package 12 and the space outside the package 12), are in the dense state. This is an effective configuration to further improve the hermeticity even when the bonding area is not large.

Also, the gap between the crystal resonator plate 2 and the first sealing member 3 (1.00 µm or less) and the gap between the crystal resonator plate 2 and the second sealing member 4 (1.00 µm or less) are set to 0.1 times or less the thickness of the first sealing member 3 and the second sealing member 4 (30 to 80 µm). In this way, when the bonding materials 11a and 11b are bonded in the pressurized state (i.e. subjected to pressure diffusion bonding), it is possible to form the inner peripheral edge parts 111a and 111b and the outer peripheral edge parts 112a and 112b of the bonding materials 11a and 11b in a further dense state, which further improves the hermeticity of the bonding materials 11a and 11b. Furthermore, forming the first sealing member 3 and the second sealing member 4 each having a flat plate shape can lead to reduction in processing cost and simplification of the structure. In addition, it is possible to ensure the total rigidity of the first sealing member 3, the second sealing member 4 and the crystal resonator 10.

The position of the outer peripheral edge of the resonator-plate-side first bonding pattern 251 of the crystal resonator plate 2 may differ from the position of the outer peripheral edge of the sealing-member-side first bonding pattern 321 of the first sealing member 3 in plan view. Also, the position of the outer peripheral edge of the resonator-plate-side second bonding pattern 252 of the crystal resonator plate 2 may differ from the position of the outer peripheral edge of the sealing-member-side second bonding pattern 421 of the second sealing member 4 in plan view. Similarly to the above, the position of the inner peripheral edge of the resonator-plate-side first bonding pattern 251 of the crystal resonator plate 2 may differ from the position of the inner peripheral edge of the sealing-member-side first bonding pattern 321 of the first sealing member 3 in plan view. Also, the position of the inner peripheral edge of the resonator-plate-side second bonding pattern 252 of the crystal resonator plate 2 may differ from the position of the inner peripheral edge of the sealing-member-side second bonding pattern 421 of the second sealing member 4 in plan view. In these cases, the width of the resonator-plate-side first bonding pattern 251 of the crystal resonator plate 2 may differ from the width of the sealing-member-side first bonding pattern 321 of the first sealing member 3. Also, the width of the resonator-plate-side second bonding pattern 252 of the crystal resonator plate 2 may differ from the width of the sealing-member-side second bonding pattern 421 of the second sealing member 4.

With the above-described configuration, it is possible to absorb the lamination displacement (position displacement) that is generated when the crystal resonator plate 2, the first sealing member 3 and the second sealing member 4 are laminated and bonded. Accordingly, even when such a lamination displacement is generated, it is possible to form the inner peripheral edge parts 111a and 111b and the outer peripheral edge parts 112a and 112b of the bonding materials 11a and 11b in the dense state. The crystal resonator plate 2 is required to ensure the region on which are provided the first and second excitation electrodes 221 and 222, and the first and second extraction electrodes 223 and 224. Thus, taking into account the easiness in pattern formation or the downsizing of the package 12, it is preferable to set the width of the resonator-plate-side first bonding pattern 251 of the crystal resonator plate 2 smaller than the width of the sealing-member-side first bonding pattern 321 of the first sealing member 3. Similarly to the above, it is preferable to set the width of the resonator-plate-side second bonding pattern 252 of the crystal resonator plate 2 smaller than the width of the sealing-member-side second bonding pattern 421 of the second sealing member 4.

Also, in the case where the first sealing member 3 and the second sealing member 4 are made of crystal, the crystal resonator plate 2, the first sealing member 3 and the second sealing member 4 have the same coefficient of thermal expansion, which makes possible to prevent deformation of package 12 caused by difference in the coefficient of thermal expansion among the crystal resonator plate 2, the first sealing member 3 and the second sealing member 4. Thus, it is possible to improve the hermeticity of the internal space 13 in which is hermetically sealed the vibrating part 22 of the crystal resonator plate 2. Also, distortion of the package 12 due to the deformation is transmitted to the first excitation electrode 221 and the second excitation electrode 222 via the connecting part 24, which may cause frequency variations. However, it is possible to reduce such frequency variations by use of the crystal resonator plate 2, the first sealing member 3 and the second sealing member 4, all of which are made of crystal.

Similarly to the method for manufacturing the crystal resonator 10 as describe above, the method for manufacturing the crystal resonators 10a to 10c according to Variations 1 to 3 (see FIGS. 10 to 17) includes: the step of forming a first sealing member wafer (ST 11); the step of forming a crystal resonator plate wafer (ST 12); the step of forming a second sealing member wafer (ST 13); the lamination step (ST 14); and the singulation step (ST 15) (see FIG. 20). However, in the method for manufacturing the crystal resonators 10a to 10c according to Variations 1 to 3, the respective bonding patterns (metal film made of Au; Au layer) formed by sputtering in the step of forming the first sealing member wafer (ST 11), the step of forming the crystal resonator plate wafer (ST 12) and the step of forming the second sealing member wafer (ST 13) differ from the bonding patterns in the above-described method for manufacturing the crystal resonator 10.

The present invention can be embodied in other forms without departing from the spirit, scope or essential characteristics thereof. The foregoing embodiments are therefore to be considered in all respects as illustrative and not restrictive. The scope of the present invention is indicated by the appended claims rather than by the foregoing description. Furthermore, all modifications and changes that come within the meaning and range of equivalency of the claims are intended to be embraced therein.

Regarding the numbers of the annular patterns of the resonator-plate-side first bonding pattern and the resonator-plate-side second bonding pattern of the crystal resonator plate, the sealing-member-side first bonding pattern of the first sealing member, and the sealing-member-side second bonding pattern of the second sealing member, the respective numbers as described above were given as examples. The other configurations may be applied. For example, it is possible to adopt 3 or more annular patterns as the resonator-plate-side first bonding pattern and the resonator-plate-side second bonding pattern of the crystal resonator plate, the sealing-member-side first bonding pattern of the first sealing member, and the sealing-member-side second bonding pattern of the second sealing member. Also, the number of the annular patterns of the resonator-plate-side first bonding pattern of the crystal resonator plate may differ from the number of the annular patterns of the resonator-plate-side second bonding pattern of the crystal resonator plate. The number of the annular patterns of the sealing-member-side first bonding pattern of the first sealing member may differ from the number of the annular patterns of the sealing-member-side second bonding pattern of the second sealing member.

Figure 21:
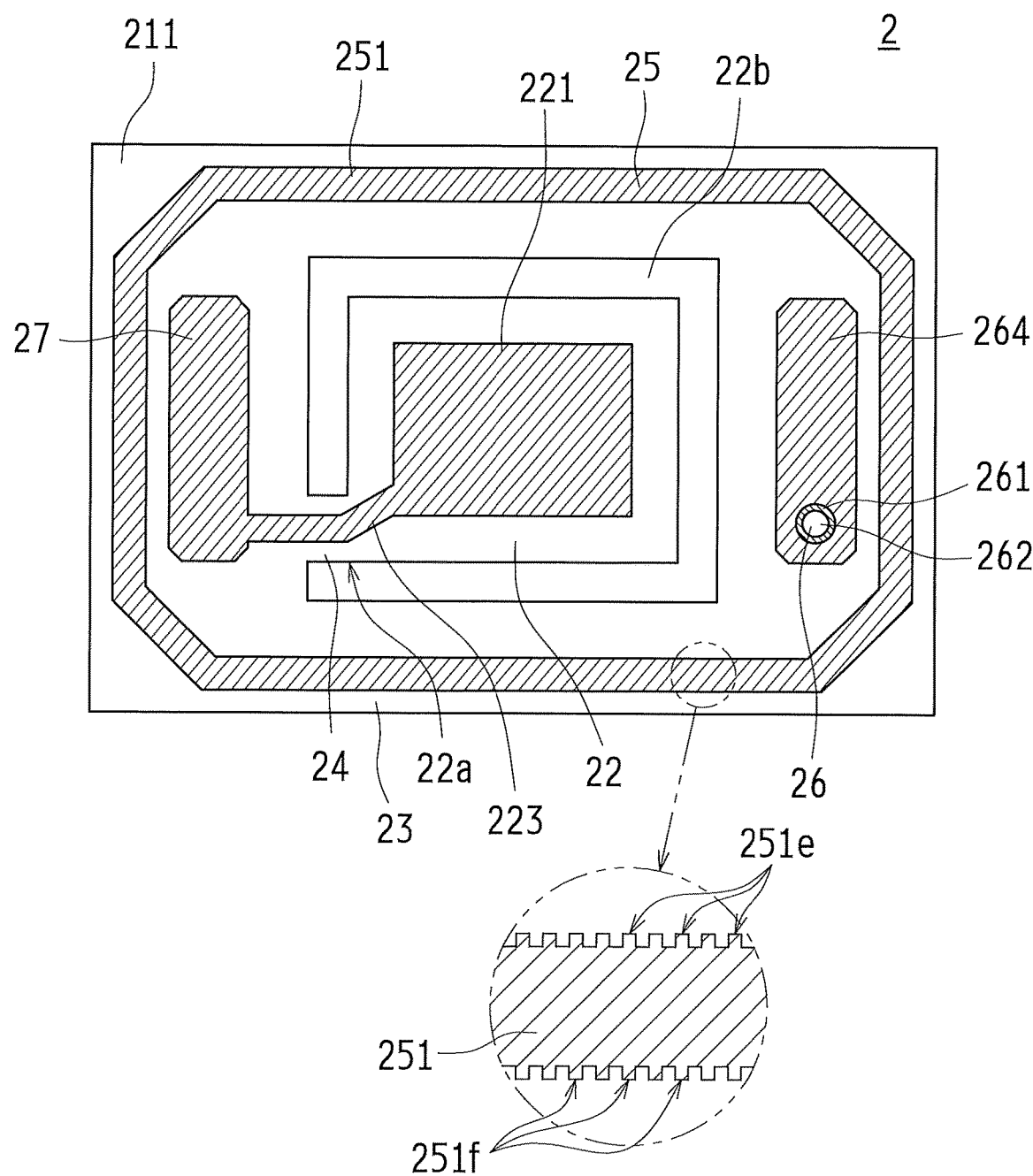
FIG. 21 is a schematic plan view illustrating the crystal resonator plate that is provided in the crystal resonator according to Variation 4.

Also, a plurality of convex parts (protrusions) may be provided on at least one of the inner peripheral edge and the outer peripheral edge of each of the annular patterns. In Variation 4 as shown in FIG. 21, a plurality of protrusions is provided on the inner peripheral edge and the outer peripheral edge of each of the annular patterns of the resonator-plate-side first bonding pattern 251 of the crystal resonator plate 2 and the sealing-member-side first bonding pattern 321 of the first sealing member 3. Specifically, a plurality of rectangular-shaped protrusions 251e and 251f is formed at predetermined intervals respectively at the inner peripheral edge and the outer peripheral edge of the resonator-plate-side first bonding pattern 251 of the crystal resonator plate 2. The protrusions 251e and 251f are formed respectively on the entire peripheries of the inner peripheral edge and the outer peripheral edge of the resonator-plate-side first bonding pattern 251. The similar protrusions are also formed at the inner peripheral edge and the outer peripheral edge of the sealing-member-side first bonding pattern 321 of the first sealing member 3, respectively at the positions corresponding to the protrusions 251e and 251f of the resonator-plate-side first bonding pattern 251, as they are not shown in the figure. Thus, the plurality of protrusions are respectively formed on the inner peripheral edge part 111a and the outer peripheral edge part 112a of the bonding material 11a (see FIG. 9), which ensures a large length of each of the inner peripheral edge part 111a and the outer peripheral edge part 112a of the bonding material 11a. Thus, the bond strength of the bonding material 11a can be improved.

The plurality of protrusions may be formed at either one of the inner peripheral edge and the outer peripheral edge of each of the annular patterns of the resonator-plate-side first bonding pattern 251 of the crystal resonator plate 2 and the sealing-member-side first bonding pattern 321 of the first sealing member 3. The shape of the protrusions 251e and 251f is not limited to the rectangular shape. They may have a triangular shape or an arc shape. Similarly to the above, a plurality of protrusions may be formed at the inner peripheral edge and/or the outer peripheral edge of each of the annular patterns of the resonator-plate-side second bonding pattern 252 of the crystal resonator plate 2 and the sealing-member-side second bonding pattern 421 of the second sealing member 4. Furthermore, a plurality of protrusions may be formed only at a certain part of the inner peripheral edge and/or the outer peripheral edge of each of the annular patterns.

Also, the slit may have a shape other than the annular shape. The slit may be formed only in a certain part of each of the patterns (i.e. the resonator-plate-side first bonding pattern and the resonator-plate-side second bonding pattern of the crystal resonator plate, the sealing-member-side first bonding pattern of the first sealing member, and the sealing-member-side second bonding pattern of the second sealing member). That is, the silt may be provided only in a part of each of the patterns so that no slit is provided in the rest of each of the patterns. In this case, taking into account improvement of the hermeticity of the annular sealing bonding materials, it is preferable to provide the slit in a part of each of the patterns along the long side of the package 12.

Herein above, the description was given on the case in which the present invention is applied to the crystal resonator. However, the present invention can be applied to a piezoelectric resonator device other than the crystal resonator (for example, a crystal oscillator).

In the crystal resonator 10 as described above, the through holes (the first to third through holes 26, 45 and 46) to establish conduction between the electrodes are formed inside the inner peripheries of the bonding materials 11a and 11b. In the crystal oscillator, the similar through holes sometimes formed outside the outer peripheries of the bonding materials 11a and 11b. Such a crystal oscillator (in Variation 5) is described with reference to FIGS. 22 and 23.

Figure 22:
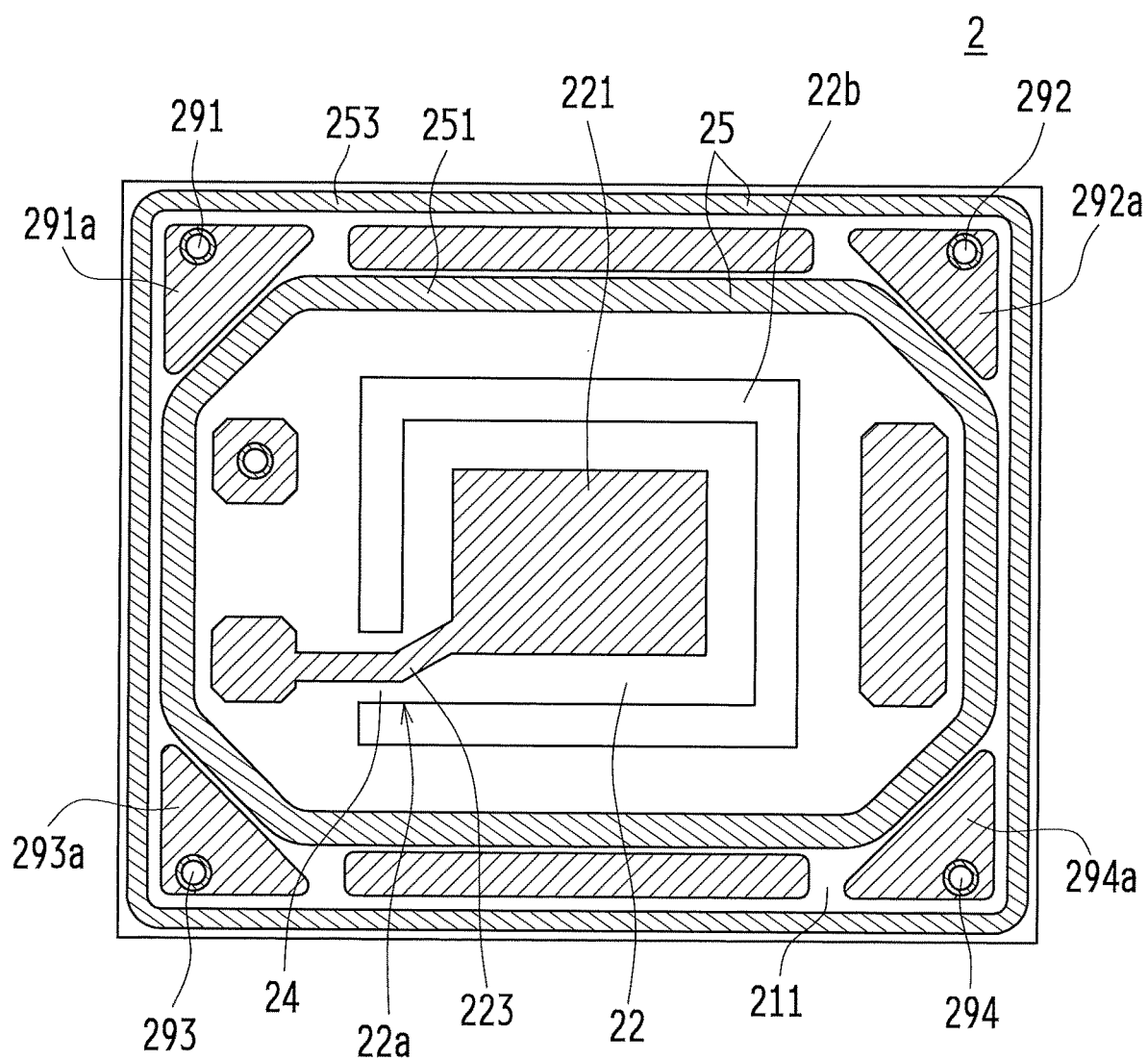
FIG. 22 is a schematic plan view illustrating the crystal resonator plate that is provided in a crystal oscillator according to Variation 5.

As shown in FIG. 22, four through holes 291 to 294 are formed outside the outer periphery of the resonator-plate-side first bonding pattern 251 (annular pattern) on the first main surface 211 of the crystal resonator plate 2. Surrounding the respective through holes 291 to 294, the connecting bonding patterns 291a to 294a are formed. Also, on the first main surface 211 of the crystal resonator plate 2, a resonator-plate-side third bonding pattern 253 is formed as the resonator-plate-side sealing part 25 in addition to the resonator-plate-side first bonding pattern 251. The resonator-plate-side third bonding pattern 253 is close to the outer peripheral edge of the first main surface 211 of the crystal resonator plate 2, and is formed so as to have an annular shape in plan view. That is, the resonator-plate-side third bonding pattern 253 is provided on more outer peripheral side than the resonator-plate-side first bonding pattern 251 and the connecting bonding patterns 291a to 294a are provided. The resonator-plate-side third bonding pattern 253 can be formed in the same process as the process for forming the resonator-plate-side first bonding pattern 251. Annular patterns similar to the resonator-plate-side third bonding pattern 253 are also formed outside the outer periphery of the resonator-plate-side second bonding pattern 252 of the crystal resonator plate 2, outside the outer periphery of the sealing-member-side first bonding pattern 321 of the first sealing member 3, and outside the outer periphery of the sealing-member-side second bonding pattern 421 of the second sealing member 4, as they are not shown in the figure.

Figure 23:
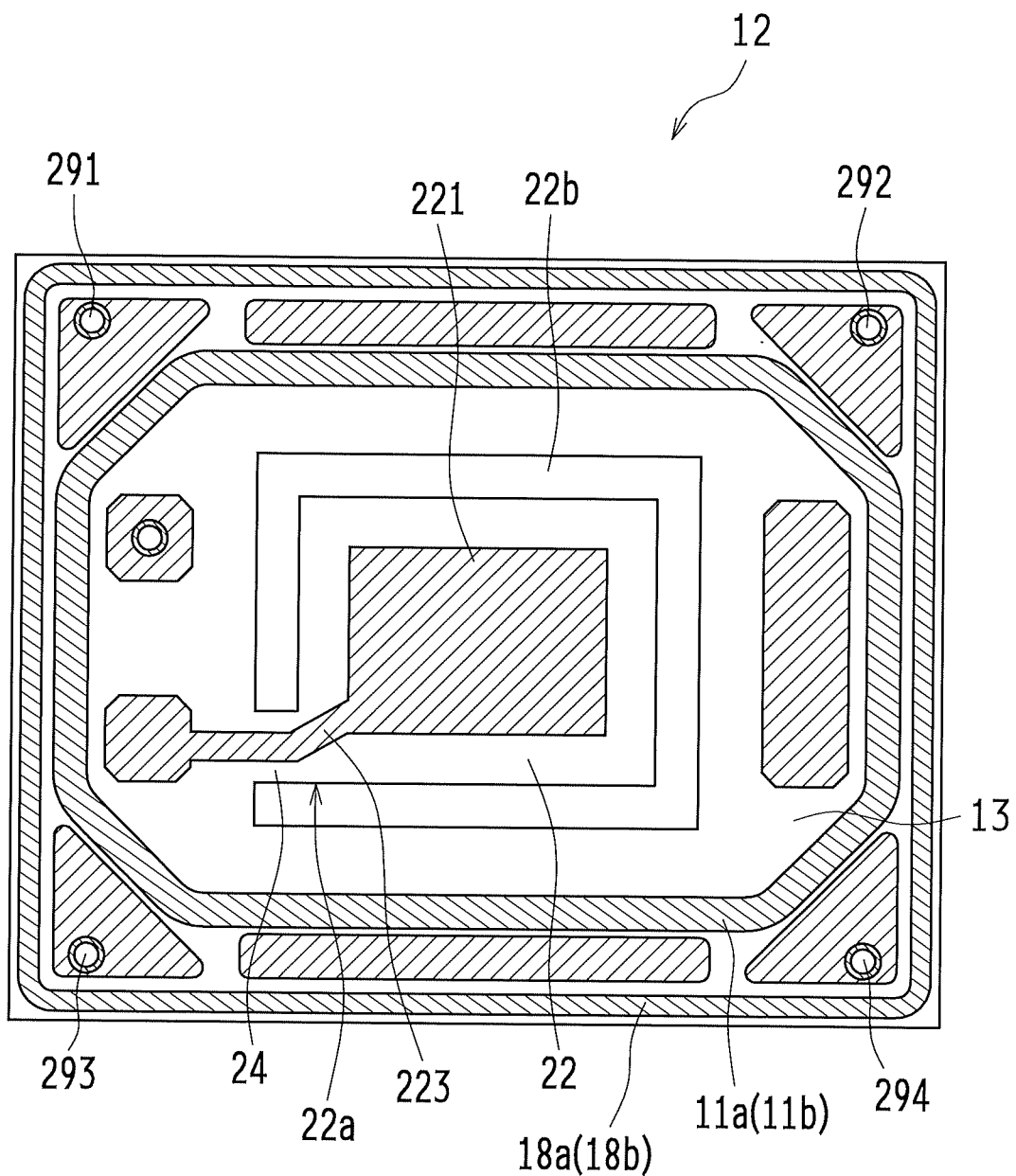
FIG. 23 is a diagram illustrating a positional relationship in plan view between the vibrating part and the sealing part of the crystal oscillator.

As shown in FIG. 23, when the first sealing member 3 and the crystal resonator plate 2 are bonded, the above-described annular patterns are subjected to the diffusion bonding so as to be a bonding material 18a. Similarly to the above, when the crystal resonator plate 2 and the second sealing member 4 are bonded, the above-described annular patterns are subjected to the diffusion bonding so as to be a bonding material 18b. The bonding materials 18a and 18b are close to the outer peripheral edge of the package 12 of the crystal oscillator in plan view, and are formed so as to each have an annular shape in plan view. That is, the bonding materials 18a and 18b are provided on more outer peripheral side than the bonding materials 11a and 11b are provided.

In this Variation, similarly to the above-described bonding materials 11a and 11b, the bonding materials 18a and 18b are also formed as the annular sealing parts (sealing bonding materials) to seal the vibrating part 22 causing piezoelectric resonance. That is, the vibrating part 22 causing piezoelectric resonance is doubly sealed by the bonding materials 11a and 11b on the inner peripheral side and the bonding materials 18a and 18b on the outer peripheral side. Similarly to the above-described bonding materials 11a and 11b, the inner peripheral edge parts and the outer peripheral edge parts of the respective bonding materials 18a and 18b are formed denser than the intermediate parts formed respectively between the inner peripheral edge parts and the outer peripheral edge parts. The inner peripheral edge parts and the outer peripheral edge parts of the respective bonding materials 11a and 11b and the inner peripheral edge parts and the outer peripheral edge parts of the respective bonding materials 18a and 18b are formed so as to each have an annular shape, which means that the vibrating part 22 is quadruply sealed. Therefore, in this Variation, it is possible to increase the annular bonding regions in the dense state, which further improves the hermeticity for sealing the vibrating part 22.

The AT-cut crystal is used for the crystal resonator plate as the first member, however, the present invention is not limited thereto. Any crystal other than the At-cut crystal may be used. Also, the AT-cut crystal is used for the first sealing member and the second sealing member as the second member, however, the present invention is not limited thereto. Any crystal other than the At-cut crystal or a brittle material other than the crystal (for example, glass) may be used.

In the above-described embodiments, the description was given on the case in which the present invention is applied to the piezoelectric resonator device having the configuration in which the crystal resonator plate is sandwiched between the first sealing member and the second sealing member (i.e. the sandwich structure). However, the present invention can be applied to a piezoelectric resonator device having another configuration. For example, it is possible to apply the present invention to a piezoelectric resonator device having a configuration in which a piezoelectric resonator piece is housed in the internal space formed by a base (first member) and a lid (second member). In this case, the base (first member) is formed in a box shape in which an annular wall part is disposed on the outer periphery of a bottom part. A first metal film is formed on an upper face of the annular wall part while an annular second metal film is formed on a lower face of the lid (second member). Thus, the first metal film and the second metal film are bonded to each other, and an annular sealing bonding material is formed. The lid may have a flat plate shape or a cap shape having an annular wall part on the outer periphery of the flat-plate shaped member.

In the above-described embodiments, the description was given on the method for manufacturing the plurality of packages of the crystal resonator devices including the steps: forming the crystal wafer by laminating the first sealing member wafer, the crystal resonator plate wafer and the second sealing member wafer; and singulating the crystal wafer. However, the present invention can be applied to another manufacturing method.

Also, the respective outer edges and inner edges of the sealing bonding materials such as the bonding materials 11a and 11b each have an octagonal shape. However, the present invention is not limited thereto. The respective outer edges and inner edges of the sealing bonding materials may each have, for example, a rectangular shape, or any polygonal shape of pentagon or more such as a pentagonal shape and a hexagonal shape. Apart from the polygonal shape, the respective outer edges and inner edges of the sealing bonding materials may also each have a shape including a curved part.

Also, the sealing bonding materials such as the bonding materials 11a and 11b are arranged at a predetermined interval from the outer peripheral edge of the package 12. However, the sealing bonding materials may be extended adjacent to the outer peripheral edge of the package 12.

Also, as the external electrode terminals, the two terminals (the first external electrode terminal 431 and the second external electrode terminal 432) are provided. However, the present invention is not limited thereto. For example, the desirable number of external electrode terminals such as four terminals, six terminals and eight terminals may be provided.

INDUSTRIAL APPLICABILITY

The present invention is suitable for a piezoelectric resonator device such as a crystal resonator or a crystal oscillator in which a vibrating part causing piezoelectric resonance is hermetically sealed by annular sealing bonding materials, and for a method for manufacturing the piezoelectric resonator device.

DESCRIPTION OF REFERENCE NUMERALS

10 Crystal resonator
11a, 11b Bonding material (sealing bonding material)
111a, 111b Inner peripheral edge part
112a, 112b Outer peripheral edge part
113a, 113b Intermediate part
12 Package
13 Internal space
2 Crystal resonator plate (first member)
22 Vibrating part
221 First excitation electrode
222 Second excitation electrode
251 Resonator-plate-side first bonding pattern (first metal film)
252 Resonator-plate-side second bonding pattern (first metal film)
3 First sealing member (second member)

321 Sealing-member-side first bonding pattern (second metal film)
4 Second sealing member (second member)
421 Sealing-member-side second bonding pattern (second metal film)

The invention claimed is:

1. A piezoelectric resonator device comprising:
a first member on which a first metal film is annularly formed;
a second member on which a second metal film is annularly formed;
an annular sealing bonding material made by bonding the first metal film and the second metal film to each other; and
a vibrating part hermetically sealed by the sealing bonding material, the vibrating part causing piezoelectric resonance,
wherein an inner peripheral edge part and an outer peripheral edge part of the sealing bonding material are each formed denser than an intermediate part between the inner peripheral edge part and the outer peripheral edge part.

2. The piezoelectric resonator device according to claim 1,
wherein the first metal film and the second metal film are each formed so as to be divided into an inner peripheral side metal film and an outer peripheral side metal film by an annular slit, and
wherein the sealing bonding material is formed so as to be divided into an inner peripheral side sealing bonding material and an outer peripheral side sealing bonding material.

3. The piezoelectric resonator device according to claim 1,
wherein the first metal film is formed so as to be divided into an inner peripheral side metal film and an outer peripheral side metal film by an annular slit, and
wherein the sealing bonding material is formed so as to be divided into an inner peripheral side sealing bonding material and an outer peripheral side sealing bonding material.

4. The piezoelectric resonator device according to claim 1,
wherein respective positions of outer peripheral edges of the first metal film and the second metal film differ from each other in plan view.

5. The piezoelectric resonator device according to claim 1, further comprising:
a piezoelectric resonator plate including a first excitation electrode formed on a first main surface of a substrate, and a second excitation electrode formed on a second main surface of the substrate, the second excitation electrode making a pair with the first excitation electrode;
a first sealing member covering the first excitation electrode of the piezoelectric resonator plate; and
a second sealing member covering the second excitation electrode of the piezoelectric resonator plate,
wherein the sealing bonding material is interposed between the first sealing member and the piezoelectric resonator plate, and furthermore between the piezoelectric resonator plate and the second sealing member.

6. The piezoelectric resonator device according to claim 5,
wherein the first sealing member and the second sealing member are each made of a brittle material having a thickness of 30 to 80 μm, and
wherein a gap between the first sealing member and the piezoelectric resonator plate and a gap between the piezoelectric resonator plate and the second sealing member are each set to 0.1 times or less the thickness of the first sealing member and the second sealing member.

7. A method for manufacturing a piezoelectric resonator device, the piezoelectric resonator device comprising:
a first member on which a first metal film is annularly formed;
a second member on which a second metal film is annularly formed;
an annular sealing bonding material made by bonding the first metal film and the second metal film to each other; and
a vibrating part hermetically sealed by the sealing bonding material, the vibrating part causing piezoelectric resonance,
wherein the first metal film and the second metal film are both metal films made of Au and formed by sputtering,
wherein the sealing bonding material is formed in a pressurized state,
wherein the second member is made of a brittle material having a thickness of 30 to 80 μm, and
wherein a gap between the first member and the second member is set to 0.1 times or less the thickness of the second member.

8. The method for manufacturing a piezoelectric resonator device according to claim 7,
wherein either one of the first metal film and the second metal film is formed so as to be divided into an inner peripheral side metal film and an outer peripheral side metal film by an annular slit, and
wherein the sealing bonding material is formed so as to be divided into an inner peripheral side sealing bonding material and an outer peripheral side sealing bonding material.

9. The method for manufacturing a piezoelectric resonator device according to claim 7,
wherein the first metal film and the second metal film are each formed so as to be divided into an inner peripheral side metal film and an outer peripheral side metal film by an annular slit, and
wherein the sealing bonding material is formed so as to be divided into an inner peripheral side sealing bonding material and an outer peripheral side sealing bonding material.

10. A method for manufacturing a piezoelectric resonator device, the piezoelectric resonator device comprising:
a first member on which a first metal film is annularly formed;
a second member on which a second metal film is annularly formed;
an annular sealing bonding material made by bonding the first metal film and the second metal film to each other; and
a vibrating part hermetically sealed by the sealing bonding material, the vibrating part causing piezoelectric resonance,
wherein the first metal film and the second metal film are both metal films made of Au and formed by sputtering,
wherein the sealing bonding material is formed in a pressurized state,
wherein the piezoelectric resonator device further comprises:
a piezoelectric resonator plate including a first excitation electrode formed on a first main surface of a substrate, and a second excitation electrode formed on a second main surface of the substrate, the second excitation electrode making a pair with the first excitation electrode;

a first sealing member covering the first excitation electrode of the piezoelectric resonator plate; and a second sealing member covering the second excitation electrode of the piezoelectric resonator plate, wherein the sealing bonding material is formed between the first sealing member and the piezoelectric resonator plate, and furthermore between the piezoelectric resonator plate and the second sealing member.

* * * * *